US006664562B2

(12) United States Patent
Weiss et al.

(10) Patent No.: US 6,664,562 B2
(45) Date of Patent: Dec. 16, 2003

(54) DEVICE INTEGRATED ANTENNA FOR USE IN RESONANT AND NON-RESONANT MODES AND METHOD

(75) Inventors: Manoja D. Weiss, Lafayette, CO (US); Blake J. Eliasson, Boulder, CO (US); Garret Moddel, Boulder, CO (US)

(73) Assignee: The Regents of the University of Colorado, Boulder, CO (US)

( * ) Notice: Subject to any disclaimer, the term of this patent is extended or adjusted under 35 U.S.C. 154(b) by 0 days.

(21) Appl. No.: 10/265,935

(22) Filed: Oct. 5, 2002

(65) Prior Publication Data

US 2003/0128919 A1 Jul. 10, 2003

Related U.S. Application Data

(63) Continuation-in-part of application No. 09/860,988, filed on May 21, 2001.

(51) Int. Cl.[7] ..................... H01L 29/06; H01L 31/0328; H01L 31/0336; H01L 31/072; H01L 31/109
(52) U.S. Cl. ........................... 257/21; 257/25; 343/741; 343/793
(58) Field of Search ..................... 257/21, 25; 343/741, 343/793

(56) References Cited

U.S. PATENT DOCUMENTS

| 4,445,050 A | | 4/1984 | Marks | |
|---|---|---|---|---|
| 6,091,374 A | * | 7/2000 | Barnes | 343/787 |
| 6,323,821 B1 | * | 11/2001 | McLean | 343/795 |
| 6,329,958 B1 | * | 12/2001 | McLean et al. | 343/787 |
| 2002/0014999 A1 | | 2/2002 | Crowley | |

OTHER PUBLICATIONS

G. Ghione and C. Naldi, "Analytical formulas for coplanar lines in hybrid and monolithic MIC's," Electron. Lett., vol. 20, pp. 179–181 (1984).

Tae–Whan Yoo and Kai Chang, "Theoretical and experimental development of 10 and 35 GHz rectennas," IEEE Transactions on Microwave Theory and Techniques, vol. 40, No. 6, pp. 1259–1266 (1992).

(List continued on next page.)

Primary Examiner—David Nelms
Assistant Examiner—Tu-Tu Ho
(74) Attorney, Agent, or Firm—Michael Pritzkau; Yoriko Morita; Stephen C. Shear

(57) ABSTRACT

An assembly includes a device for receiving at least one input to produce an output. An antenna arrangement supports the device to transfer the input to the device and further to transfer the output from the device such that the antenna arrangement supports a selected one of the input and the output as a high frequency current. The antenna includes a peripheral configuration which confines high frequency current to at least one dominant path to oscillate in the dominant path and the other one of the input and the output is a lower frequency signal present at least generally throughout the antenna arrangement. At least one port is positioned sufficiently away from the dominant path to isolate the lower frequency signal from surface current in the dominant path. The assembly is usable in modulation, emitting, mixing and detection modes and may include a resonant or non-resonant configuration.

87 Claims, 10 Drawing Sheets

OTHER PUBLICATIONS

Ashok Agrawal and Walter E. Powell, "Monopulse printed circuit dipole array," IEEE Transactions on Antennas and Propagation, vol. AP–33, No. 11, pp. 1280–1283 (1985).

Yu–De Lin and Syh–Nan Tsai, "Coplanar waveguide–fed uniplanar bow–tie antenna," IEEE Transactions on Antennas and Propagation, vol. 45, No. 2, pp. 305–306 (1997).

C. Fumeaux, W. Hermann, F.K. Kneubübhl, H. Rothuizen, B. Lipphardt, and C.O. Weiss, "Nanometer–thin–film Ni–NiO–Ni diodes for mixing 28 THz $CO_2$ –laser emissions with difference frequencies up to 176 GHz," Appl. Phys. B. vol. 66, pp. 327–332 (1998).

D.B. Rutledge, D.P. Neikirk and D.P. Kasilingam, "Integrated–Circuit Antennas," *Infrared and Millimeter Waves*, Kenneth J. Button, ed., vol. 10, Academic Press, pp. 24–27, 74–81 (1983).

David B. Rutledge and Michael S. Muha, "Imaging antenna arrays," IEEE Transactions on Antennas and Propagation, vol. AP–30, No. 4, pp. 535–540 (1982).

J.G. Simmons, "Electric tunnel effect between dissimilar electrodes separated by a thin insulating film," J. Appl. Phys., vol. 34, No 34, No. 9, pp. 2581–2590 (1963).

S.R. Pollack and C.E. Morris, "Electon tunneling through asymmetric films of thermally grown $Al_2O_3$," J. Appl. Phys., vol. 35, No. 5 (1964).

L.O. Hocker, D. R. Sokoloff, V. Daneu, A. Szoke and A. Javan, "Frequency mixing in the infrared and far–infrared using a metal–to–metal point contact diode," Appl. Phys. Lett., vol. 12, No. 12, pp. 401–402 (1968).

S.M. Faris et al., "Detection of optical and infrared radiation with DC–biased electron–tunneling metal–barrier–metal diodes," IEEE J. Quantum Electron., vol. QE–9, No. 7 (1973).

B. Michael Kale, "Electron tunneling devices in optics," Opt. Eng., vol. 24, No. 2 (1985).

C. Fumeaux et al., "Nanometer thin–film Ni–NiO–Ni diodes for detection and mixing of 30 THz radiation," Infrared Phys. and Technol., vol. 39 (1988).

T. Suemasu et al., "Metal ($CoSi_2$)/Insulator($CaF_2$) resonant tunneling diode," Japanese J. Appl. Phys., vol. 33 (1994).

M. Asada et al., "Theoretical analysis and fabrication of small area Metal/Insulator resonant tunnelting diode integrated with patch antenna for terahertz photon assisted tunneling," Solid State Electron., vol. 42, No. 7–8, pp. 1548–1546 (1998).

G. Papp et al., "Current rectification through a single–barrier resonant tunneling quantum structure," Superlattices and Microstrutures, vol. 17, No. 3, p. 273 (1995).

* cited by examiner

DEVICE INTEGRATED ANTENNA FOR USE IN RESONANT AND NON-RESONANT MODES AND METHOD

RELATED APPLICATION

The present application is a Continuation in Part of U.S. patent application Ser. No. 09/860,988, entitled METAL-OXIDE ELECTRON TUNNELING DEVICE FOR SOLAR ENERGY CONVERSION, filed on May 21, 2001 which is incorporated herein by reference in its entirety.

STATEMENT REGARDING FEDERALLY SPONSORED RESEARCH

The United States Government has rights in this invention pursuant to a contract awarded by a U.S. intelligency community organization.

BACKGROUND OF THE INVENTION

The present invention relates generally to arrangements for receiving and emanating electromagnetic signals and, more particularly, to a device integrated antenna arrangement which is usable in resonant and non-resonant modes.

Recent energy crises have highlighted the growing demands placed on traditional sources of power, such as gas and electricity. With rising energy costs, it is desirable to find alternative power sources to augment traditional power sources such as hydroelectric and thermonuclear. Solar energy conversion provides such an alternative by tapping into the readily available power of the sun.

One of the main obstacles preventing the proliferation of solar energy conversion systems is efficiency. Currently available semiconductor solar cell systems are not able to provide the amount of power for the dollar that is possible by traditional power sources. Especially semiconductor solar cells with high energy conversion efficiency (ratio of incident solar power to electrical power out) are expensive. Most solar cell systems are based on semiconductor technology, which can be difficult to scale to the size required for large solar panels. Using the present technology, it is expensive to fabricate a semiconductor-based solar panel which is large enough to replace the traditional sources of power. Moreover, semiconductor devices are generally single bandgap energy devices. This characteristic of semiconductor devices means that no current is produced when a photon having energy less than the bandgap energy is incident on the semiconductor device and, when a photon having energy greater than the bandgap energy is incident on the semiconductor device, only current corresponding to the bandgap energy is produced in the semiconductor device. In other words, the response of the semiconductor device is limited by the bandgap energy. Thus, the semiconductor device does not respond at all to photons having energy less than the bandgap energy, and incident electromagnetic energy in excess of the bandgap energy is wasted in the energy conversion. Therefore, the energy conversion efficiency of the semiconductor device is low, on the order of 25% or less. Therefore, it would be desirable to achieve effective solar energy conversion using materials other than semiconductors.

One possible alternative to semiconductors is the use of a metal-insulator-metal (MIM) configurations[1-6]. The MIM configuration is relatively inexpensive to manufacture in comparison to semiconductor-based systems. The native oxides of the metals are generally used as the insulator materials, therefore the MIM configuration is straightforward to fabricate. Efforts have been made even as recently as 1998 (See Ref. 6) to improve the characteristics of MIM devices, without substantially modifying the basic MIM configuration. Recent research in this area include efforts to use the MIM configuration to potentially provide devices capable of detecting and mixing signals at optical frequencies at optical communications wavelengths.

Turning now to the drawings, wherein like components are indicated by like reference numbers throughout the various figures, attention is immediately directed to FIGS. 1A–1E. FIGS. 1A–1E illustrate the operation of an MIM device for reference purposes. As a simplified configuration, an MIM device is illustrated in FIG. 1A. The MIM device, generally indicated by reference number 10, includes first and second metal layers 12 and 14, respectively, with an insulator layer 16 positioned therebetween. A corresponding energy band profile 20 is shown in FIG. 1B. Energy band profile 20 represents height of the Fermi level in the metals and the height of the conduction band edge in the insulator (y-axis 22) as a function of distance (x-axis 24) through MIM device 10 in the absence of provided voltage across the device. FIG. 1C illustrates a first modified energy band profile 30 when a voltage is provided in a reverse direction to MIM device 10. The voltage may be provided by, for example, an applied external voltage or an induced voltage due to the incidence of electromagnetic energy. In this case, tunneling of the electrons (not shown) can occur in a reverse direction, represented by an arrow 36. In contrast, as shown in FIG. 1D, when a voltage is provided in a forward direction to MIM device 10, a second modified energy band profile 40 results. In the case of the situation shown in FIG. 1D, tunneling of the electrons can again occur but in a forward direction, represented by an arrow 46. FIG. 1E illustrates a typical I–V curve 50 of current (y-axis 52) as a function of voltage (x-axis 54) for MIM device 10. I–V curve 50 demonstrates that the MIM device functions as a rectifying element. An MIM device provides rectification and energy detection/conversion by tunneling of electrons between first and second metal layers 12 and 14.

Continuing to refer to FIGS. 1A–1E, in energy conversion applications, it is further desirable to achieve high degrees of asymmetry and nonlinearity and sufficiently high current magnitudes in the current-to-voltage performance (I–V curve). If the current magnitude is too low, the incident electromagnetic energy will not be collected with high efficiency. The required current magnitude is a function of the MIM device geometry, dielectric properties of the oxide, and the size and number of the incident electromagnetic energy quanta. A higher degree of asymmetry in the I–V curve between positive values of V (forward bias voltage) and negative values of V (reverse bias voltage) about the operating point results in better rectification performance of the device. In addition, the differential resistance of the device, which influences the responsivity and coupling efficiency of the device to incoming electromagnetic energy, is directly related to the nonlinearity of the I–V curve. An optimal value of differential resistance is required to impedance match the MIM device to the antenna resulting in maximum power transfer to the device. The differential resistance of MIM devices are often too large for energy conversion applications and, consequently, it is desirable to lower differential resistance values in order to impedance match the antenna. In other words, in solar energy conversion applications, it is preferable to have a higher degree of nonlinearity in the I–V curve and optimal value of differential resistance in the device, thus yielding higher sensitivity of the device to incoming solar energy. As a result, high degrees of asymmetry and nonlinearity in the current-to-voltage characteristics of the device yields high efficiency in the energy conversion process. Currently available MIM devices are not able to provide sufficiently high degrees of asymmetry and nonlinearity with sufficiently low differential resistance in the current-to-voltage performance, hence the energy conversion efficiency of MIM devices is low.

A known alternative to the simple MIM device is a device with additional metal and insulator layers, as demonstrated by Suemasu, et al. (Suemasu)[7] and Asada, et al. (Asada).[8] The devices of Suemasu and Asada have the configuration of MIMIMIM, in which the three insulator layers between the outer metal layers act as a triple-barrier structure. The insulator layers are crystalline insulator layers formed by an epitaxial growth procedure detailed in Ref. 7. The presence of the barriers between the outer metal layers result in resonant tunneling of the electrons between the outer metal layers under the appropriate bias voltage conditions, as opposed to simple, tunneling of the MIM device. The resonant tunneling mechanism in the electron transport yields increased asymmetry and nonlinearity and reduced differential resistance values for the MIMIMIM device. The resonance tunneling also results in a characteristic resonance peak in the current-voltage curve of the device, which yields a region of negative differential resistance and leads to the possibility of optical devices with very fast responses and high efficiency.

However, the MIMIMIM devices of Suemasu and Asada have the distinct disadvantage of being a much more complicated device than the simple MIM device. The fabrication procedure of Suemasu includes the deposition of cobalt, silicon and calcium fluoride to form alternating layers of $CoSi_2$ and $CaF_2$. These rather exotic layer materials were chosen due to the crystalline lattice matching constraints inherent in the epitaxial growth procedure. Several of the difficulties in the fabrication procedure, such as the problem with agglomeration of cobalt on the $CaF_2$ layer as well as the multiple photolithography and selective etching steps required to form the final device after the MIMIMIM layers have been grown, are described in Ref. 7. Suemasu also contends that the use of a triple-barrier structure, rather than a slightly simpler double-barrier structure, is necessary in order to achieve negative differential resistance resulting from resonant tunneling using only metal and insulator layer combinations, thus avoiding the use of semiconductor materials. In addition, Suemasu requires that the thickness of the individual metal and insulator layers must be strictly controlled to the atomic layer level in order to achieve the resonance tunneling effect. Therefore, although the goal of increased nonlinearity and asymmetry may be achieved in the MIMIMIM devices of Suemasu and Asada using metal and insulator combinations, the simplicity of the MIM structure is lost.

An alternative device structure that has been suggested to achieve resonant tunneling in semiconductor devices is the use of two adjacent insulator layers between two semiconductor layers, resulting in a semiconductor-insulator-insulator-semiconductor (SIIS) structure described by Papp, et al. (Papp).[9] Papp describes a theoretical SIIS structure, in which the two crystalline insulator layers are formed of two different insulator materials by crystal growth techniques. The SIIS structure is said to yield a resonant tunneling effect with negative differential resistance, increased nonlinearity and asymmetry as well as negative differential resistance, similar to that shown in the aforedescribed MIMIMIM devices of Suemasu and Asada, although an actual SIIS structure has not yet been implemented, to the Applicants' knowledge. Current crystal growth techniques theoretically enable the implementation of the SIIS structure, but an SIIS device would still embody the drawbacks inherent in semiconductor materials, namely cost efficiency in large area devices. In addition, Suemasu (see Ref. 7) speculates that the recent trend of decreasing the size of electronic devices in order to achieve high speed switching will make semiconductor-based devices impractical due to fluctuation of carrier concentration, which occurs when semiconductor devices are reduced to mesoscopic regimes.

The energy which is detected and converted by the MIM diode can be delivered to the diode by means of an antenna as described by Fumeaux et. al. in [6]. The antennas used at infrared frequencies are typically planar since they are fabricated using semiconductor fabrication techniques such as metal evaporation and patterning. The bowtie antenna, in particular, is a popularly used antenna for infrared detectors since it is broadband and less susceptible to fabrication tolerances than a dipole antenna. The detected signal is extracted from the diode by using low frequency leads. In previous work, low frequency leads have been connected across the bowtie antenna center terminals where the diode is connected, or across the entirety of the outermost edges of the antenna arms. The former, which will be referred to as the center-fed arrangement is presented by Fumeaux et. al. [6]. The latter edge-fed arrangement is shown in one paper by Rutledge and Muha et. al. [10] as well as in another paper by Rutledge et al. [11]. As will be described at appropriate points below, the present invention recognizes certain problems with both the center-fed arrangement and the edge-fed arrangement which are thought to be unresolved by the prior art.

As will be seen hereinafter, the present invention provides a significant improvement over the prior art as discussed above by virtue of its ability to provide the increased performance while, at the same time, having significant advantages in its manufacturability. This assertion is true for electromagnetic devices generally, which take advantage of the present invention, as well as solar energy conversion devices in particular. Moreover, certain problems relating to prior art center-fed and edge-fed configurations are thought to be resolved.

REFERENCES

1. J. G. Simmons, "Electric tunnel effect between dissimilar electrodes separated by a thin insulating film," *Journal of Applied Physics*, 34 (1963).
2. S. R. Pollack and C. E. Morris, "Electron tunneling through asymmetric films of thermally grown $Al_2O_3$," *Journal of Applied Physics*, vol. 35, no. 5 (1964).
3. L. O. Hocker, et al., "Frequency mixing in the infrared and far–infrared using a metal-to-metal point contact diode," *Applied Physics Letters*, vol. 12, no. 12 (1968).
4. S. M. Faris, et al., "Detection of optical and infrared radiation with DC-biased electron-tunneling metal-barrier-metal diodes," *IEEE Journal of Quantum Electronics*, vol. QE-9, no. 7 (1973).
5. B. Michael Kale, "Electron tunneling devices in optics," *Optical Engineering*, vol. 24, no. 2 (1985).
6. C. Fumeaux, et al., "Nanometer thin-film Ni—NiO—Ni diodes for detection and mixing of 30 THz radiation," *Infrared Physics and Technology*, 39 (1998).
7. T. Suemasu, et al., "Metal ($CoSi_2$)/Insulator($CaF_2$) resonant tunneling diode," *Japanese Journal of Applied Physics*, vol. 33 (1994).
8. M. Asada, et al., "Theoretical analysis and fabrication of small area Metal/Insulator resonant tunneling diode integrated with patch antenna for terahertz photon assisted tunneling," *Solid State Electronics*, vol. 42, no. 7–8 (1998).
9. G. Papp, et al., "Current rectification through a single-barrier resonant tunneling quantum structure," Superlattices and Microstructures, vol. 17, no. 3 (1995).
10. Rutledge, D. B., and Muha, M. S., "Imaging Antenna Arrays," IEEE Trans. On Antennas and Propagation, Vol. AP-30, 1982, pp. 535–540.
11. Rutledge, D. B., Neikirk, D. P., and Kasilingam, D. P., Chapter 1, page 25, "Infrared and Millimeter Waves," Vol. 10, Edited by Kenneth J. Button.

SUMMARY OF THE INVENTION

As will be described in more detail hereinafter, there is disclosed herein an electron tunneling device including first and second non-insulating layers. The first and second non-insulating layers are spaced apart from one another such that a given voltage can be provided across the first and second non-insulating layers, either by an applied external bias voltage or, for example by an induced voltage due to the incidence of solar energy without an applied voltage or both. The electron tunneling device further includes an arrangement disposed between the first and second non-insulating layers and configured to serve as a transport of electrons between the first and second non-insulating layers. This arrangement includes a first layer of an amorphous material configured such that using only the first layer of the amorphous material in the arrangement would result in a given value of a first parameter in the transport of electrons, with respect to the given voltage. However, in accordance with one aspect of the invention, the arrangement includes a second layer of material, which second layer is configured to cooperate with the first layer of amorphous material such that the transport of electrons includes, at least in part, transport by a mechanism of tunneling, and such that the first parameter, with respect to the given voltage, is increased over and above the given value of the first parameter. The first parameter is, for example, nonlinearity or asymmetry in the electron transport.

In another aspect of the invention, the first layer of amorphous material, if used alone in the arrangement of the electron tunneling device, would result in a given value of a second parameter in the transport of electrons, with respect to the given voltage, but the second layer of material is also configured to cooperate with the first layer of amorphous material such that second parameter in the transport of electrons, with respect to the given voltage, is reduced below the given value of the second parameter. The second parameter is, for example, differential resistance.

In yet another aspect of the invention, a device for converting solar energy incident thereon into electrical energy is described. The device has an output and provides the electrical energy at the output. The device includes first and second non-insulating layers spaced apart from one another such that a given voltage can be provided across the first and second non-insulating layers. The device also includes an arrangement disposed between the first and second noninsulating layers and configured to serve as a transport of electrons between the first and second non-insulating layers. The arrangement includes a first layer of an amorphous material. The arrangement also includes a second layer of material configured to cooperate with the first layer of the amorphous material such that the transport of electrons includes, at least in part, transport by a mechanism of tunneling, and such that the solar energy incident on the first and second non-insulating layers, at least in part, is extractable as electrical energy at the output.

In a further aspect of the present invention, an assembly includes a device configured for receiving at least one input to produce an output responsive thereto. An antenna arrangement supports the device to transfer the input to the device and further to transfer the output from the device such that the antenna arrangement supports a selected one of the input and the output as a high frequency current and the antenna arrangement includes a peripheral configuration which confines the high frequency current to at least one dominant path within the antenna arrangement so that the high frequency current oscillates in the dominant path and so that the other one of the input and the output is a lower frequency signal that is present at least generally throughout the antenna arrangement. At least one port, within the antenna arrangement, is positioned sufficiently away from the dominant path so as to isolate the lower frequency signal at the port from the high frequency current in the dominant path.

In a continuing aspect of the present invention, an assembly includes a device configured for receiving at least one input to produce an output responsive thereto. An antenna arrangement supports the device to transfer the input to the device and further to transfer the output from the device such that the antenna arrangement supports a selected one of the input and the output as a high frequency current and the antenna arrangement includes a peripheral configuration which confines the high frequency current to at least one dominant path within the antenna arrangement and the other one of the input and the output is a lower frequency signal that is present at least generally throughout the antenna arrangement. At least one port, within the antenna arrangement, at a location selected such that the high frequency current travels past the port in at least one direction that is away from the device, and the port is positioned sufficiently away from the dominant path so as to isolate the lower frequency signal at the port from the high frequency current in the dominant path.

In an additional aspect of the present invention, an assembly includes a device configured for receiving at least one input to produce an output responsive thereto. An antenna arrangement supports the device to transfer the input to the device and further to transfer the output from the device such that the antenna arrangement supports a selected one of the input and the output as a high frequency current and the antenna arrangement includes a peripheral configuration which confines the high frequency current to at least one resonant path within the antenna arrangement so that the high frequency current oscillates in the resonant path between a pair of opposing first and second reflector configurations that are formed as part of the peripheral outline and so that the other one of the input and the output is a lower frequency signal that is present at least generally throughout the antenna arrangement. At least one port, within the antenna arrangement, which port is positioned sufficiently away from each one of the first and second reflector configurations so as to sustain reflection of the surface current in the resonant path while conducting the lower frequency signal.

In another aspect of the present invention, an assembly includes a device configured for receiving at least one input to produce an output responsive thereto. An antenna arrangement includes a bowtie peripheral configuration defining a bowtie intersection for supporting the device at the bowtie intersection to transfer the input to the device and further to transfer the output from the device such that the antenna arrangement supports a selected one of the input and the output as a high frequency current and the bowtie peripheral configuration confines the high frequency current to at least one dominant path within the antenna arrangement so that the high frequency current oscillates in the dominant path traveling through the bowtie intersection and so that the other one of the input and the output is a lower frequency signal that is present at least generally throughout the antenna arrangement. At least one port, within the antenna arrangement, is positioned spaced apart from the bowtie intersection and sufficiently away from the dominant path or paths so as to isolate the lower frequency signal at the port from the high frequency current in the dominant path.

In a related feature, an assembly produced in accordance with the present invention may be configured for operation in any one of a modulation mode, a mixing mode, a detection mode and an emitting mode dependent upon the type of active device that forms part of the assembly.

BRIEF DESCRIPTION OF THE DRAWINGS

The present invention may be understood by reference to the following detailed description taken in conjunction with the drawings briefly described below.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein.

Figure 2A:
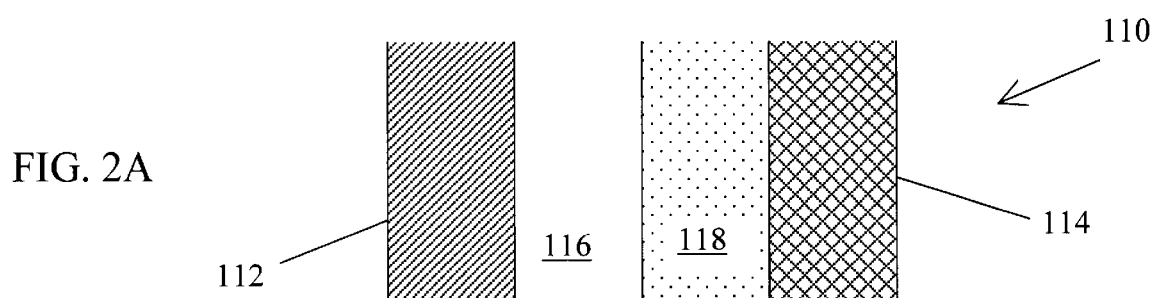
FIG. 2A is a diagrammatic illustration of an electron tunneling device designed in accordance with the present invention.

Referring now to FIG. 2A, an electron tunneling device designed in accordance with the present invention is described. The electron tunneling device, generally indicated by reference number 110, includes a first non-insulating layer 112 and a second non-insulating layer 114. Non-insulating materials include, for example, metals, superconductors, semiconductors, semimetals, quantum wells and superlattice structures. First non-insulating layer 112 and second non-insulating layer 114 can be formed, for example, of two different metals, such as chromium and aluminum, by conventional methods such as, but not limited to, thermal evaporation and sputtering. First non-insulating layer 112 and second non-insulating layer 114 are spaced apart such that a given voltage can be provided therebetween. The given voltage can be, for instance, a bias voltage from an external voltage source (not shown) that is directly applied to the first and second non-insulating layers. Alternatively, as will be seen, the given voltage can be induced by, for example, solar energy. Furthermore, the given voltage can be a combination of induced voltage (from incident electromagnetic radiation, for example) and an applied external bias voltage.

Continuing to refer to FIG. 2A, a first amorphous layer 116 is disposed between first non-insulating layer 112 and second non-insulating layer 114. For purposes of this application, an amorphous material is considered to include all materials which are not single crystal in structure. First amorphous layer 116 can be, for example, a native oxide of first non-insulating layer 112. For instance, if a layer of chromium is used as first non-insulating layer 112, the layer of chromium can be oxidized to form a layer of chromium oxide to serve as first amorphous layer 116. Other suitable materials include, but are not limited to, silicon dioxide, niobium oxide, titanium oxide, aluminum oxide, zirconium oxide, tantalum oxide, hafnium oxide, yttrium oxide, magnesium oxide, silicon nitride and aluminum nitride. Electron tunneling device 110 further includes a second layer 118 positioned between first non-insulating layer 112 and second non-insulating layer 114. Second layer 118 is formed of a predetermined material, which is different from first amorphous layer 116 and is configured to cooperate with first amorphous layer 116 such that first amorphous layer and second layer 118 serve as a transport of electrons between the first and second non-insulating layers. The predetermined material, which forms second layer 118, can be, for example, an amorphous insulator such as, but not limited to, chromium oxide, silicon dioxide, niobium oxide, titanium oxide, aluminum oxide, zirconium oxide, tantalum oxide, hafnium oxide, yttrium oxide, magnesium oxide, silicon nitride, aluminum nitride and a simple air or vacuum gap. Preferably, second layer 118 is formed of a material having a lower or higher work function than that of first amorphous layer such that the device exhibits an asymmetry in the energy band diagram.

Had the device consisted of only the first and second non-insulating layers and the first amorphous layer, the device would be essentially equivalent to the prior art MIM device and would exhibit a given degree of nonlinearity, asymmetry and differential resistance in the transport of electrons. However, the inclusion of second layer 118, surprising and unexpectedly, results in increased degrees of nonlinearity and asymmetry over and above the given degree of nonlinearity and asymmetry while the differential resistance is reduced, with respect to the given voltage. This increase in the nonlinearity and asymmetry and reduction in differential resistance is achieved without resorting to the use of epitaxial growth techniques or crystalline layers of the aforedescribed prior art. The mechanism of this increase is described immediately hereinafter in reference to FIGS. 2B–2E.

Figure 1A:
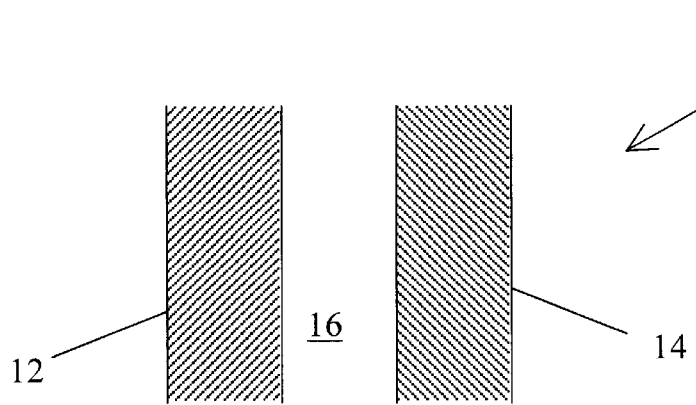
FIG. 1A is a diagrammatic illustration of a prior art device using a metal-insulator-metal (MIM) configuration.
Figure 1B:
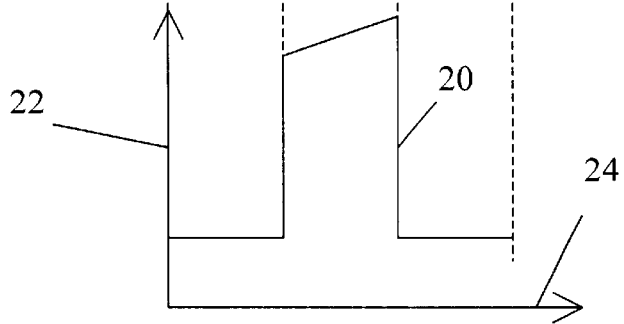
FIGS. 1B–1D are graphs illustrating the schematic energy band profiles of the MIM device of FIG. 1A for various voltages provided across the MIM device.
Figure 2B:
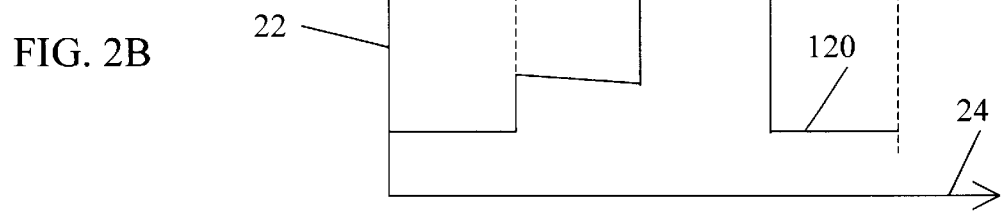
FIGS. 2B–2D are graphs illustrating the schematic energy band profiles of the electron tunneling device of FIG. 2A for various voltages provided across the electron tunneling device.

Referring to FIG. 2B in conjunction with FIGS. 1B and 2A, a schematic of a energy band profile 120 corresponding to electron tunneling device 110 is illustrated. Energy band profile 120 includes four regions corresponding to the four layers of electron tunneling device 110, in comparison to the three regions shown in energy band profile 20 of the prior art MIM device. The presence of second layer 118 contributes to the change in the energy band profile of electron tunneling device 110.

Figure 1C:
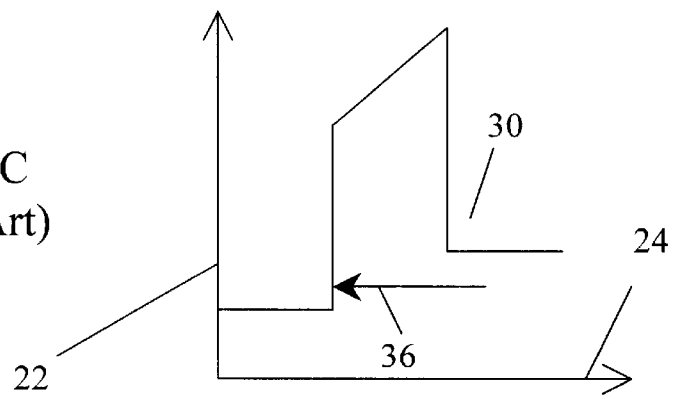
Figure 1D:
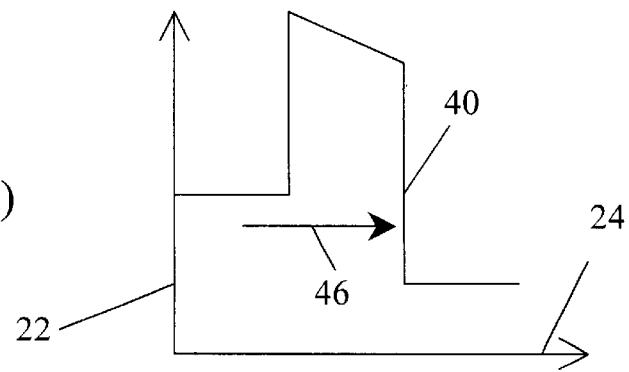
Figure 2C:
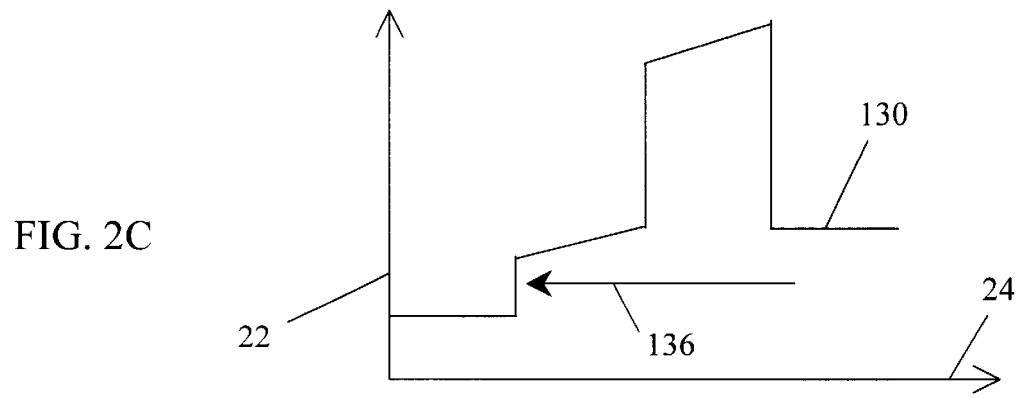
Figure 2D:
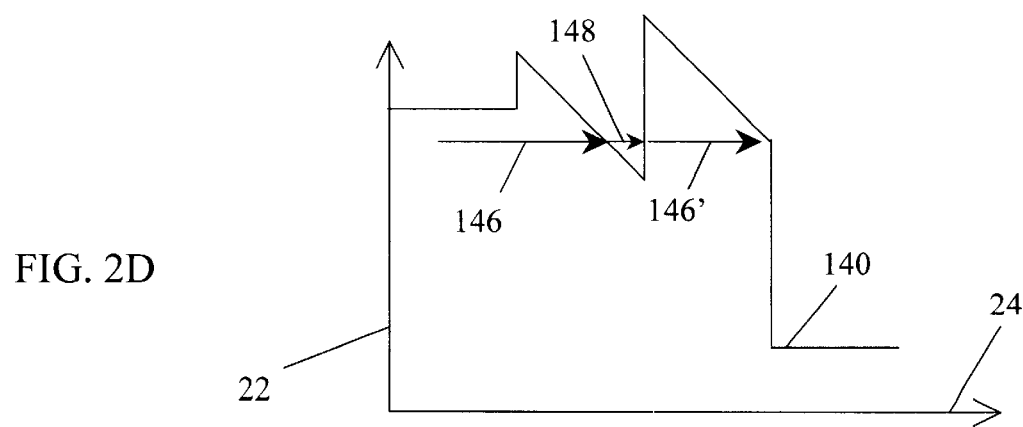

Turning now to FIGS. 2C and 2D in conjunction with FIGS. 1C and 1D, the changes in the energy band profile due to voltage application are shown. During reverse bias operation of electron tunneling device 110, the energy band profile changes to that shown as line 130, which is relatively similar to the case of reverse bias operation shown in FIG. 1C for the MIM device. In the situation shown in FIG. 2C, the primary mechanism by which electrons travel between the first and second non-insulating layers is tunneling in a reverse direction indicated by an arrow 136. When a forward bias voltage is provided, however, a modified energy band profile 140 of FIG. 2D results. In this case, tunneling occurs in paths 146 and 146', but there now exists a quantum well region through which resonant tunneling occurs, as shown by arrow 148. In the region of resonant tunneling, the ease of transport of electrons suddenly increase, therefore resulting in increased current between the non-insulating layers of electron tunneling device 110.

Continuing to refer to FIG. 2D, the addition of second layer 118 provides a path for electrons to travel through the device by a resonant tunneling rather than the tunneling process of the prior art MIM device. As a result, more current flows between the non-insulating layers of electron tunneling device 110, as compared to the MIM device, when a positive voltage is provided while the current flow with a negative voltage provided to the electron tunneling device of the present invention. The presence of resonant tunneling in electron tunneling device 110 therefore results in increased nonlinearity and asymmetry in comparison to the prior art MIM device.

Figure 1E:
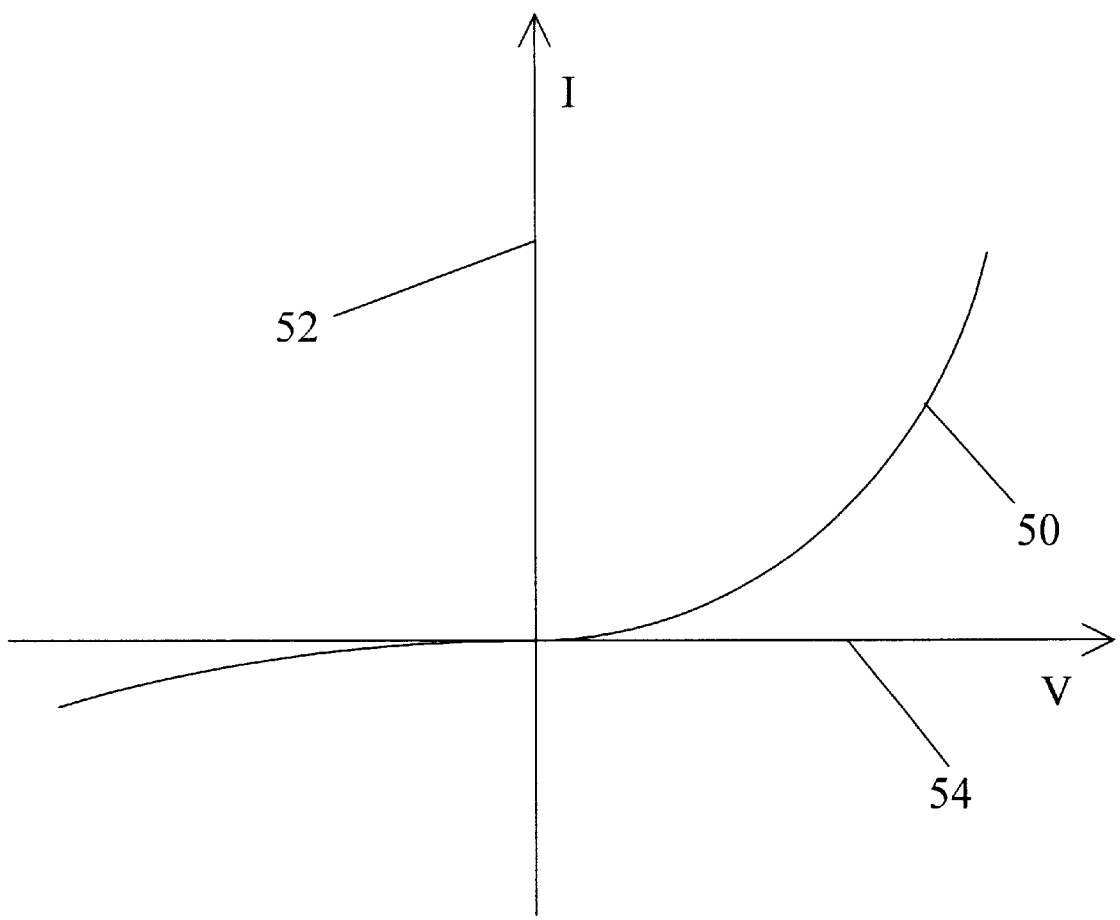
FIG. 1E is a graph of atypical current-voltage curve for the MIM device of FIG. 1A.
Figure 2E:
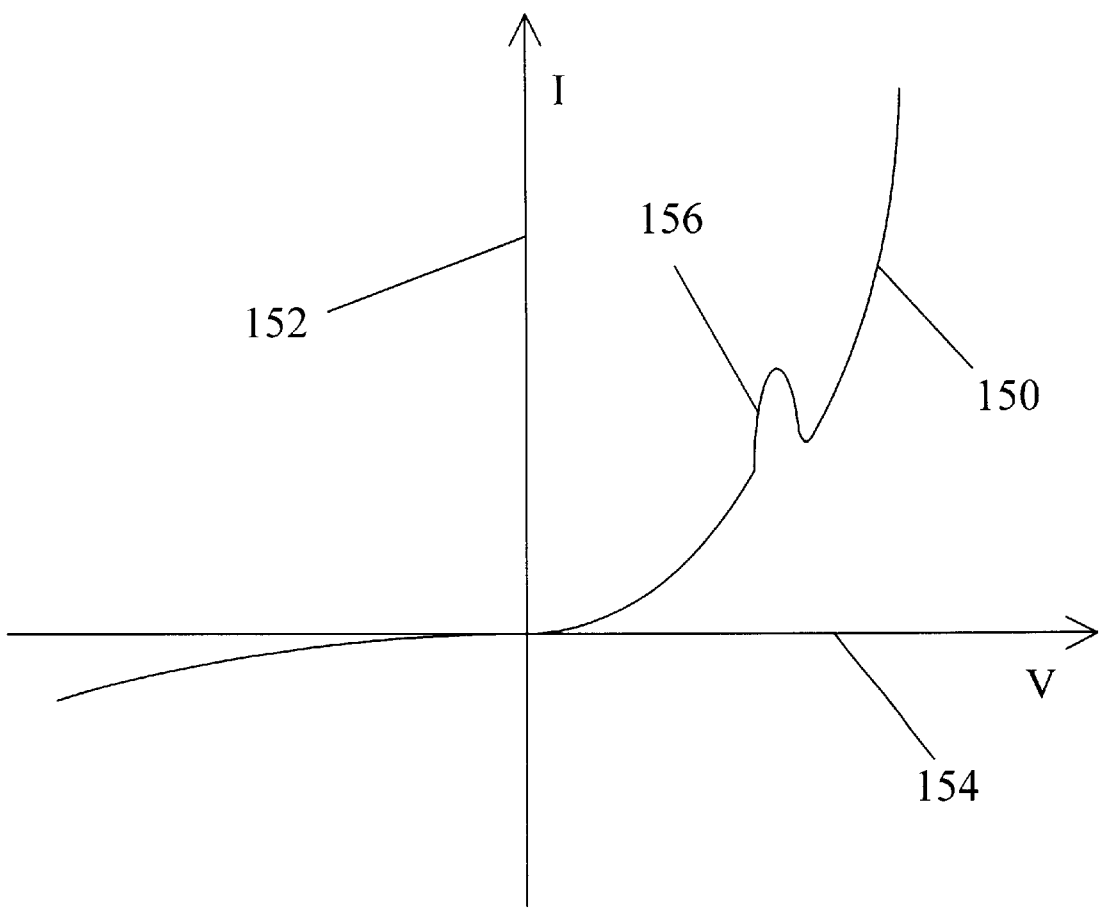
FIG. 2E is a graph of a typical current-voltage curve for the electron tunneling device of FIG. 2A.

A typical I–V curve 150 corresponding to electron tunneling device 110 is shown in FIG. 2E. I–V curve 150 demonstrates that electron tunneling device 110 functions as a diode, where the diode is defined as a two-terminal electronic element. Furthermore, I–V curve 150 is shown to include a resonance peak 156 corresponding to the provided voltage region in which resonant tunneling occurs. The appearance of resonant tunneling in actually fabricated devices of the present invention depends on the precision of the fabrication process. Even when resonance peak 156 is not present, I–V curve 150 exhibits a higher degree of asymmetry and nonlinearity in comparison to the I–V curve of the prior art MIM device (as shown in FIG. 1E). In other words, while the presence of a resonance peak in the I–V curve of an electron tunneling device of the present invention may lead to additional advantages in certain applications, such as greatly increased nonlinearity around the resonance peak, the electron tunneling device of the present invention achieves the goal of increased asymmetry and nonlinearity with reduced differential resistance in the current-to-voltage performance even when the averaging effect of the amorphous layer "washes out" the resonance peak. Therefore, electron tunneling device 110 essentially includes all of the advantages of the prior art MIMIMIM device, without the complicated fabrication procedure and the use of exotic materials, and all of the advantages of the prior art SIIS device, without the drawbacks of the use of semiconductor materials as described above. Despite and contrary to the teachings of Suemasu, the electron tunneling device of the present invention is able to achieve increased nonlinearity and asymmetry and decreased differential resistance in the transport of electrons through the device, using readily available metals and insulators in a simple structure that is simply manufactured compared to the more complex manufacturing processes of the prior art.

It is emphasized that the electron tunneling device of the present invention combines the simplicity of the MIM device with the performance characteristics of the MIM-IMIM devices of Suemasu and Asada while using readily available materials and avoiding the use of semiconductors. Although superficially similar to the SIIS device in structure at first glance due to the presence of two adjacent insulator layers, the addition of second layer 118 in electron tunneling device 110 is not easily accomplished due to fundamental differences in the fabrication procedure (crystal growth and doping techniques in the semiconductor devices versus the oxidation and deposition techniques used in the present invention). In fact, Suemasu and Asada resort to the more complex MIMIMIM structure formed by epitaxial growth techniques in order to achieve the same resonant tunneling effect. The crystalline growth and epitaxial growth techniques used in the SIIS device of Papp and the MIMIMIM devices of Suemasu and Asada preclude the use of amorphous insulator materials in the SIIS device or the MIM-IMIM device since crystalline growth and epitaxial growth techniques, by definition, are able to form only crystalline layers. In fact, the crystalline materials that may be used in the SIIS device or the MIMIMIM device are limited by substrate compatibility (for the SIIS device) and crystalline lattice matching considerations (in the MIMIMIM device); that is, the specific materials that may be used in the devices of Suemasu, Asada and Papp are limited by the fabrication procedures used in manufacturing these devices.

In contrast, the insulator materials used in the electron tunneling device of the present invention may be chosen from a variety of oxides and other materials that can be deposited by sputtering, atomic layer deposition, spin-on deposition, and other readily available techniques. For example, a thin layer of metal can be deposited then oxidized to form the insulator layer. Layer adhesion may be promoted by a surfactant such as one containing silanes or organic materials. In other words, the specific choice of materials used in the electron tunneling device of the present invention can be chosen for the desired electronic characteristics of the materials, rather than being limited in the choice by the fabrication procedure. Furthermore, the inclusion of the amorphous insulator in combination with the second layer of material in the electron tunneling device of the present invention yields unexpected advantages, such as resonant tunneling. The simplicity of the electron tunneling device of the present invention yields advantages not available in the SIIS nor the MIMIMIM device in the ease of fabrication and the flexibility in the selection of materials. Moreover, the use of an amorphous insulator layer in the device, which is not feasible in the MIMIMIM devices of Suemasu and Asada nor the SIIS device of Papp due to the epitaxial growth technique requirements, allows added flexibility in the selection of materials in the present device, since amorphous rather than only compatible crystalline layers can be used, thus further distinguishing the electron tunneling device of the present invention from the prior art devices.

The resonant tunneling effect and increased asymmetry and nonlinearity and reduced differential resistance in the electron tunneling device of the present invention have been verified by the Applicants by theory and experiment. In theoretical calculations, the currently available models for MIM devices were extensively modified in accordance with re-analysis of fundamental algorithms and evaluation to allow the modeling of the electron tunneling device of the present invention. The results of the theoretical calculations verified the presence of resonant tunneling and increased asymmetry and nonlinearity with reduced differential resistance in the electron tunneling device of the configuration shown in FIG. 2A.

Experimental devices were also fabricated in accordance with the present invention and tested. A thin film deposition method based on atomic layer deposition (ALD) techniques was used in the fabrication of the second layer. Other deposition techniques, such as but not limited to sputtering may also be used in place of ALD. The fabrication process described below utilizes a lift–off technique to form the patterned metal layers. Formation of the patterned metal layer is also possible by chemical etching, reactive ion etching, milling and other techniques. A summary of the fabrication process for a typical device is as follows:

1. Thoroughly clean a silicon wafer substrate including a thermal oxide less than 1 μm thick for electrical isolation between the MIM diode and silicon substrate using a combination of baking steps and de-ionized (DI) water rinses;
2. Form a base contact pad, which is resistant to the formation of a continuous ALD insulator, to function as an antenna and contact pads (for electrically accessing the device):
   a. Lithography to define the contact pad shape:
      i O₂ plasma cleaning to de-scum the silicon wafer,
      ii. Spin on a primer (HMDS) at 6000 rpm for 30 seconds,
      iii. Spin on a resist at 6000 rpm for 30 seconds (time and spin speed are dependent on the specific resist used),
      iv. Pre-bake the resist layer at 90° C. for 25 minutes (time and temperature are dependent on the specific resist used),
      v. Expose the resist layer for 27 seconds (exposure time is dependent on the specific resist used and the resist thickness),
      vi. Develop the resist layer using a developer solution (4:1 ratio of DI water to developer) for a predetermined time, (developer solution depends upon specific resist and developer used)
      vii. Rinse off the developer with DI water,
      viii. O₂ plasma cleaning to clean the resist openings;
   b. Thermal evaporation of bond layer (100 nm of chromium) to serve as a scratch-resistant metal, through which the device can be electrically probed;
   c. Thermal evaporation of contact layer (100 nm of gold) for preventing the oxidation of the bond layer and the adhesion of a continuous ALD layer;
   d. Lift-off to remove extraneous material:
      i. Lift-off with acetone on spinner at low speed,
      ii. Ultrasonic bath with acetone (if necessary to promote lift-off),
      iii. Lift-off with acetone on spinner,
      iv. Clean with isopropyl alcohol on spinner,
      v. Spin dry;
3. Form a first non-insulating layer by repeating Step 2 (skip Step 2c) to form a 100 nm-thick Cr layer;
4. Form a first amorphous layer by oxidizing (3 days minimum under a clean hood) the first non-insulating layer to form a native oxide, less than 4 nm in thickness;
5. Form a second layer by atomic layer deposition using Al(CH₃)₃ and H₂O precursors;
6. Form the second non-insulating layer by repeating Step 3.

The fabrication procedure described above is relatively simple, compared to the fabrication procedure of the MIM-IMIM devices of Suemasu and Asada described above, and is flexible, allowing the use of various metal and oxide materials. As mentioned above, a variety of metals, such as but not limited to chromium, aluminum, niobium, tungsten, nickel, yttrium and magnesium, and a variety of oxides, such as the native oxides of the aforementioned various metals or other oxides that can be deposited onto existing amorphous layers are suitable for use in the electron tunneling device of the present invention. The resulting devices have been measured to verify the presence of the resonance peak in the I–V curve as well as the increased asymmetry and nonlinearity with reduced differential resistance. Attention is particularly directed to Step 2c, in which an additional contact layer of a metal, such as silver or gold, is deposited on top of the chromium bond layer. In this way, the contact pad is still accessible while the insulators deposited by atomic layer deposition do not form a continuous layer. In addition, other methods of lithography, such as electron beam-assisted lithography, may be used in place of the aforedescribed photolithography steps. Also, in step 1, the coupling between the antenna and electromagnetic energy may altered by alternative substrate choices such as, but not limited to, glass, quartz and other non-conductive materials that are flat and capable of withstanding the evaporation and deposition procedures, such as those described above. Furthermore, if coupling of the electromagnetic radiation from the substrate side of the device is desired a substrate transparent to the incident electromagnetic radiation can be used in place of the silicon wafer substrate.

Figure 3A:
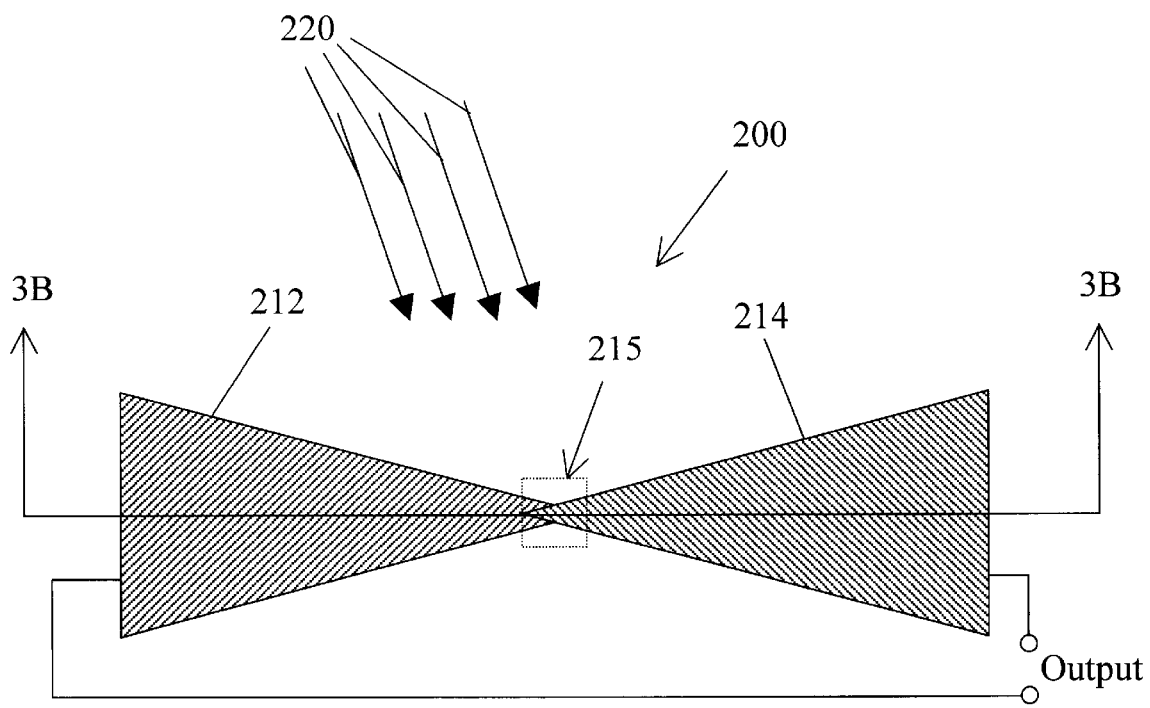
FIG. 3A is a diagrammatic top view of a device for converting solar energy incident thereon into electrical energy, designed in accordance with the present invention, shown here to illustrate a possible configuration of metal layers of the device.
Figure 3B:
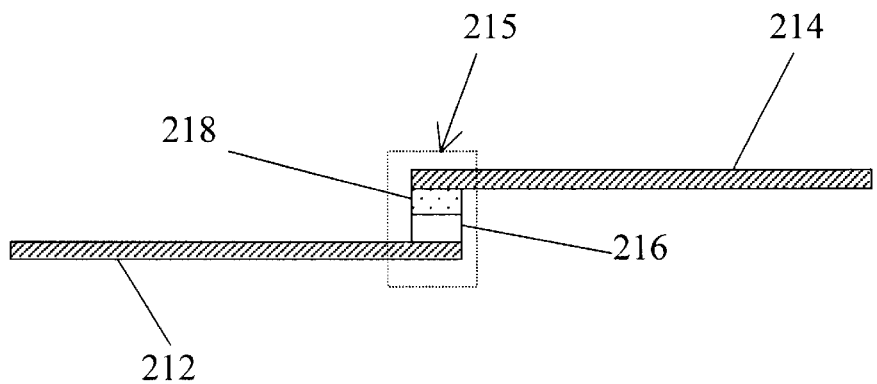
FIG. 3B is a cross sectional view of the device of FIG. 3A, shown here to illustrate additional structure positioned between the metal layers of the device.

Turning now to FIGS. 3A and 3B, a solar energy converter 200 has been developed as one application example of the present invention as described above. Solar energy converter 200 includes a first non-insulating layer 212 and a second non-insulating layer 214 corresponding to previously described layers 112 and 114, respectively. An overlap portion between the first and second non-insulating layers, indicated by a box 215, effectively forms the aforedescribed electron tunneling device. The structure of the electron tunneling device is shown more clearly in FIG. 3B, illustrating a cross sectional view of solar energy converter 200 of FIG. 3A taken along line 3B—3B. A first amorphous insulator layer 216 and a second layer 218, corresponding to previously described layers. 116 and 118, respectively, are positioned in overlap portion 215 of the first and second non-insulating layers to result in the electron tunneling device of the present invention.

As shown in FIG. 3A, first and second non-insulating layers 212 and 214, respectively, are further shaped in a form of a bow-tie antenna to focus the incident solar energy on the overlap portion, thus increasing the sensitivity of the solar energy converter to incident solar energy. The bow-tie antenna is configured to increase the sensitivity of solar energy converter 200 to broadband solar energy by being receptive to electromagnetic radiation over a range of frequencies, for example, from near-ultraviolet to near-infrared frequencies. When solar energy 220 falls on solar energy converter 200, solar energy 220 is converted to a voltage between the first and second non-insulating layers to serve as the aforementioned given voltage. A directional current is established in the overlap portion in accordance with the I–V curve for the electron tunneling device of the present invention. Thus, the incident solar energy is converted to electrical energy by electrical rectification. The electrical energy can then be extracted at an output from the solar energy converter.

It is stressed that the solar energy converter of FIGS. 3A and 3B exhibit the performance advantages of the MIM-IMIM and SIIS devices while avoiding the disadvantages of the prior art devices. Namely, solar energy converter 200 is based on a simple structure of two non-insulating layers separated by two different layers positioned therebetween, where one of the two different layers is an amorphous insulator. Due to the flexible fabrication process, the exact materials used in solar energy converter 200 can be selected from a wide variety of readily available materials, such as chromium, aluminum, titanium, niobium and silicon and the respective native oxides, and not be constrained to the use of only semiconductor materials, crystalline insulators or exotic materials, such as $CoSi_2$. Also, unlike the prior art semiconductor device, which is limited in its response by the bandgap energy, the solar energy converter of the present invention is sensitive to a wide range of incident electromagnetic energies. In fact, with an appropriately designed antenna, which is configured to be sensitive to the range of frequencies within the electromagnetic spectrum of the sun, the energy conversion efficiency upper limit of the solar energy converter of the present invention approaches 100% of the energy delivered to the electron tunneling device by the antenna. Moreover, the solar energy converter of FIGS. 3A and 3B does not require the application of an external bias voltage, other than the solar energy received by the antenna structure. The fact that the solar energy converter of the present invention does not require the application of an external bias is in contrast to prior art devices which require the application of an external bias voltage.

Figure 4:
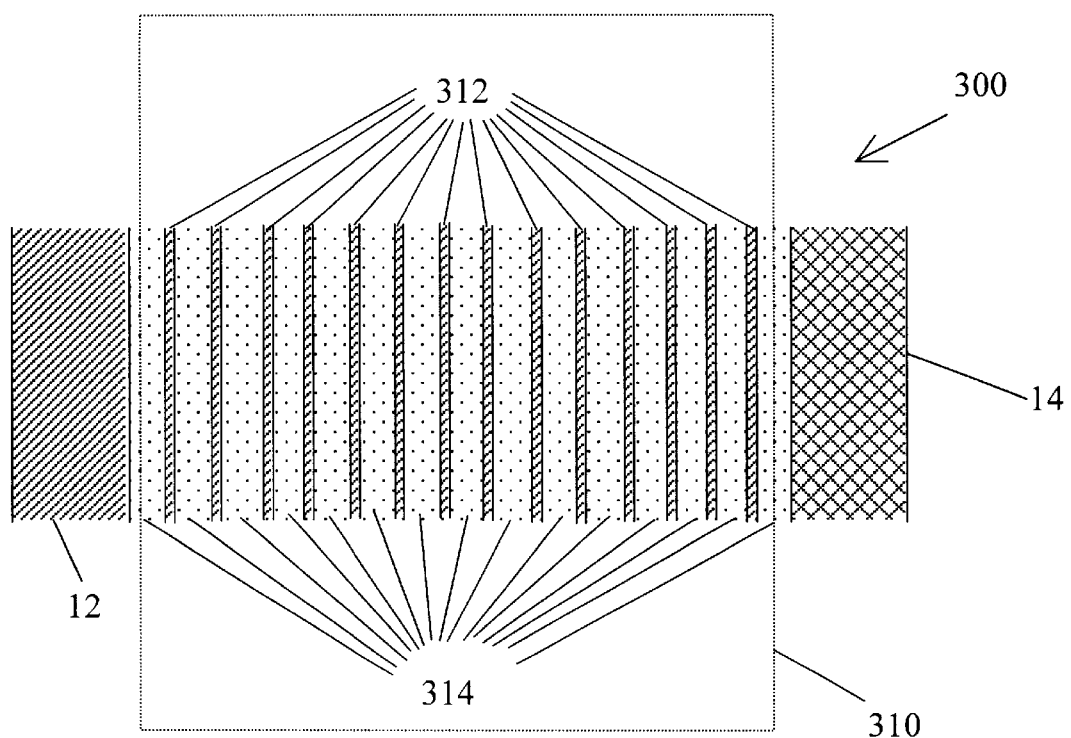
FIG. 4 is a diagrammatic illustration of an electron tunneling device of the present invention including a superlattice structure.

Turning now to FIG. 4, a variation of the electron tunneling device of the present invention is described. FIG. 4 illustrates an electron tunneling device 300 including a superlattice structure 310 positioned between first non-insulating layer 12 and second non-insulating layer 14. Superlattice structure 310 includes a plurality of thin non-insulating layers 312 separated by thin insulating layers 314. Each thin non-insulating layer 312 can be, for example, one monolayer of a metal, and each thin insulating layer 314 can be, for instance, seven monolayers of an insulator. Superlattice structure 310 provides an transport path for electrons, thus increasing electron flow between the first and second non-insulating layers. As a result, more flexibility in the design of the electron tunneling device becomes available for enhancing the performance of the device such as, for instance, increasing the device nonlinearity by selecting a suitable material to modify the height of the energy band corresponding to either the first or the second non-insulating layer.

Although each of the aforedescribed embodiments have been illustrated with various components having particular respective orientations, it should be understood that the present invention may take on a variety of specific configurations with the various components being located in a wide variety of positions and mutual orientations and still remain within the spirit and scope of the present invention. Furthermore, suitable equivalents may be used in place of or in addition to the various components, the function and use of such substitute or additional components being held to be familiar to those skilled in the art and are therefore regarded as falling within the scope of the present invention. For example, the exact materials used in the aforedescribed devices may be modified while achieving the same result of improved current-voltage performance. Also, in the solar energy converter application, other antenna shapes suitable for receiving broadband solar energy may be used in place of the bow-tie antenna.

In addition to the advantages described thus far resulting from resonant tunneling, asymmetry may be further enhanced by quantum mechanical reflections. Quantum mechanical reflections occur as a result of changes in potential energy or effective mass and are accounted for in the inventors theoretical calculations. These reflections result for electrons tunneling both above and below the band edge of the insulator. As a result of the substantially different barrier and effective mass profile of this multilayer system over single layer MIM diodes asymmetry will be enhanced even in the absence of the resonant tunneling.

Furthermore, it is noted that the slope of the conduction band in the oxide is proportional to the electric field strength, and the electric field strength in turn depends upon the dielectric constant within the oxide. Consequently, we may tailor the voltage drop or electric field strength across each of the oxide regions by using oxides with desirable dielectric constants. By controlling the electric field strength in each layer we may further tailor the resonant energy level location as a function of provided voltage.

Moreover, the asymmetry in the I–V curve of the device can be further enhanced by considering the electric field direction in the multilayer system. In tunneling, the electric field direction does not play a role in the magnitude of the tunneling probability. However, if an electron does not tunnel the entire distance through the oxide, perhaps due to a collision, the characteristics of the electric field will influence the post-collision electron direction. The direction, magnitude, and distribution of the electric field in the oxide layer can be controlled by selecting the work functions and Fermi levels of the electrodes and the dielectric constant of the oxide layers.

Referring briefly to FIG. 3A, it should be noted that outputs are taken from opposing outermost ends of first and second non-insulating layers 212 and 214. A still more detailed discussion of this highly advantageous configuration follows immediately hereinafter. Moreover, it should be noted that even though solar energy conversion has been discussed above, the present invention enjoys a broad range of applicability including high-speed detection, heterodyne mixing and modulation of optical communication signals, emission of optical radiation, millimeter wave and sub-millimeter wave detection for thermal imaging, as well as emission of electromagnetic energy. In addition, the device integrated with the antenna can take on forms other than the MIM or MIIM diodes discussed here. For example, devices which are contemplated as being useful include, but are not limited to diode types such as MIM, MIIM, SIS and Schottky, and devices such as microbolometers and Josephson junctions. The application will primarily be determined by the capabilities of the device integrated with the antenna. For a high-speed diode as the device, communication applications may be attractive, whereas for a slower speed microbolometer, a thermal imaging application might be more suitable. For the highest sensitivity, a Josephson junction as the device might be more useful.

As indicated by the foregoing list of applications, the device integrated antenna presented here can be used as a detector, a modulator, a mixer or an emitter of electromagnetic radiation. These modes of operation will be briefly described below. The inputs and outputs of the invention are either electrical or optical signals. An electrical signal is an electromagnetic signal traveling on electrical wires, whereas an optical signal is one that travels in a dielectric medium such as a waveguide or free space.

A detector captures and converts an optical signal into an electrical form. If the optical signal has been modulated, then the detector will extract the modulating signal in electrical form. The modulating signal is slowly varying in time in comparison with the higher frequency of the received electromagnetic radiation. A mixer can be thought of as a special case of a detector where two electromagnetic signals of different frequencies are received. These two frequencies are then mixed and converted into a lower frequency which is extracted as an electrical signal from the As a modulator, the present invention will capture electromagnetic radiation, imprint a modulating electrical signal upon it, and reradiate the final modulated signal. The emitter configuration is a special case of the modulator where an input electrical signal causes the emission of an electromagnetic signal in optical form.

In order to describe the basic operation of the invention, it is decomposed into three basic constituents as follow: an antenna, a device, and low frequency leads. The function of the antenna is to capture or radiate electromagnetic energy. The device integrated with the antenna has the ability to detect, modulate, or emit electromagnetic radiation. The low frequency leads are used to DC bias the device, if necessary, and also to carry the detected or modulating signal. The basic detector operation of the unit is that the antenna captures electromagnetic energy from free space or a waveguide and couples it into the device connected across the antenna terminals. This device converts the electromagnetic energy into an electrical signal which is transferred away from the antenna–diode configuration by low frequency leads. In modulator mode, the captured electromagnetic energy from the antenna is modulated by a varying electrical signal on the low frequency leads.

Figure 5:
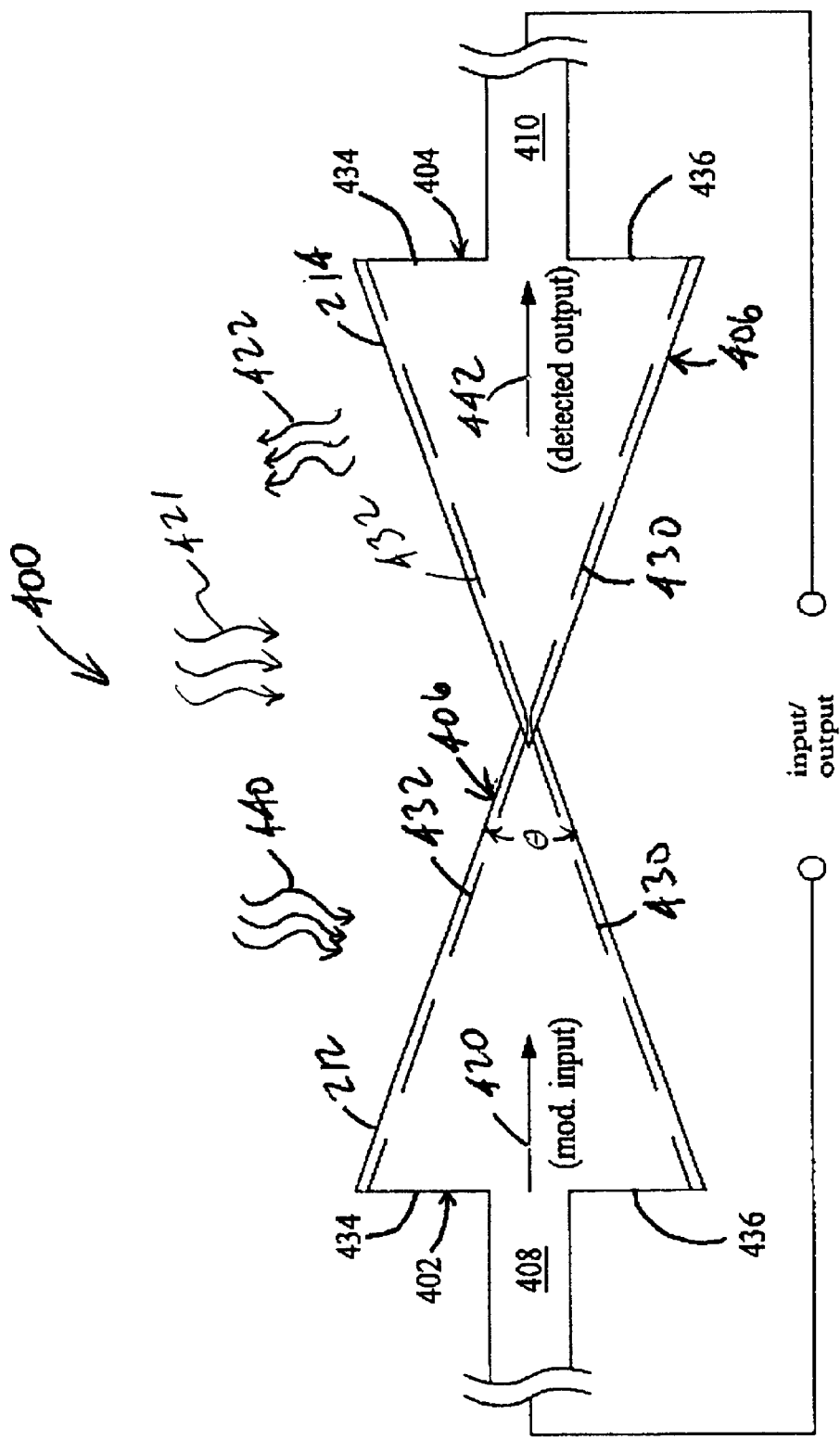
FIG. 5 is a diagrammatic illustration, in plan view, of a device integrated antenna assembly of the present invention, shown here to illustrate a resonant bowtie configuration having outermost ends including cooperating. reflection segments and outset ports.

Attention is now directed to FIG. 5 which diagrammatically illustrates a highly advantageous device integrated antenna assembly that is generally indicated by the reference number 400. Assembly 400 includes first and second non-insulating layers 212 and 214, respectively, each of which is in the form of a bow arm having outermost ends 402 and 404 which are positioned farthest from a device (not visible in this view) that is arranged proximate to the innermost ends of the bow arms between confronting portions thereof. This device arrangement is essentially identical to that shown in cross–section in FIG. 3B and described above with certain exceptions to be noted. Initially, for example, it should be appreciated that the device used in FIG. 5 may be operable in any of the modes discussed above, where the antenna is integrated with any of the devices listed above.

Still referring to FIG. 5, for convenience in these descriptions, the bow arms may be referred to as such using reference numbers 212 and 214. Accordingly, bow arms 212 and 214 cooperatively define a bowtie shaped peripheral outline 406. The bow arms further include first and second ports indicated by the reference numbers 408 and 410, respectively. In the present example, the ports are outset with respect to the outermost ends 402 and 404 of the bow arms, however, this is not a requirement, as is demonstrated by previously described FIG. 3A. The elongated, outset ports may be formed, for example, as extensions of non-insulating layers 212 and 214, respectively. The ports merge into a low frequency transmission line that is diagrammatically indicated by the reference number 412 leading to an input/output port 414. The ports may merge into any suitable electrical transmission line such as, for example, a coplanar stripline (CPS), which is not shown. In the CPS, signal propagation characteristics are determined primarily by the width and spacing of the lines as well as the dielectric properties of the substrate which supports the lines. CPS design considerations are described, as an example, by G. Ghione and C. Naldi in "Analytical formulas for coplanar lines in hybrid and monolithic MIC's," appearing in, Electron Letters, vol. 20, pages 179–181, 1984, which is incorporated by reference. During operational use, it should be understood that ports 408 and 410 may serve as either inputs or as outputs depending upon whether the arrangement is operating in a modulation mode or in a detection mode, respectively. In both modulation or detection mode, if a DC bias is needed for the proper operation of the device, the ports 408 and 410 may serve as both a bias line as well as an input or output line. In the instance where the arrangement is operating in the modulation mode, ports 408 and 410 serve as inputs whereby to inject an input electrical signal at a given frequency. This given frequency may reside in a frequency range of approximately DC to several terahertz and is selected such that the wavelength at this frequency is significantly larger than the bowtie antenna in a way which causes the input electrical signal to be present at least generally throughout the antenna arrangement. That is, a voltage induced across the first and second non-insulating layers is not confined as to specific regions of the bow arms. As a result, a modulation device at the center of the bowtie configuration readily receives the input electrical signal. For bow arm 212, the input electrical signal is shown as a modulation mode input signal 420, indicated by an arrow, along a path extending from port 408 directly to the modulation device. It is to be understood that such a modulation mode input signal also travels from port 410 to the modulation device, but has not been shown due to illustrative constraints.

At the same time, an incident electromagnetic wave 421 such as, for example, ambient light is incident upon bow arms 212 and 214 so as to induce high frequency "surface" currents. While these currents may be referred to in this description as well as in the appended claims using the terms high frequency currents or "surface currents", it is to be understood that the current being described is present at or proximate to the surface of each bow arm and is additionally induced up to some depth, from a practical standpoint, into the non-insulating body of the bow arm carrying the current. Generally, such surface current decays rapidly with increasing depth into its conducting body so as to exhibit significantly higher magnitudes in the immediate vicinity of the surface.

Still considering details with regard to the subject surface currents, because the wavelength characterizing the surface currents is relatively small in comparison to the geometry of the bowtie antenna, another important property of the surface currents arises. Specifically, and again unlike the input electrical signal, the surface currents are not only confined depthwise in the bow arms, but are also confined in a lateral sense on the surface of the bow arms at which they are induced. While, the low frequency electrical signal is uniformly present across the lateral extents of the bow arms which make up the antenna arrangement, the surface currents are confined in the plane of FIG. 5, to particular paths within the antenna arrangement which are defined, at least in part, by the peripheral outline or configuration of the bowtie antenna itself. These paths are referred to herein as dominant paths or may be referred to, in the instance of a resonant antenna, as resonant paths. In the case of a bowtie antenna, a pair of dominant paths is present. A first one of the dominant paths is shown as a first dashed line that is indicated by the reference number 430 and which is defined along a first side margin of each of the bow arms. A second one of the dominant paths is shown as a second dashed line that is indicated by the reference number 432 and which is defined along an opposing, second side margin of each of the bow arms. Each of the dominant paths passes through or intersects the device that is positioned between the confronting portions of the bow arms at their innermost ends. The modulation device responds to the input electrical signal by modulating the high frequency current flowing therethrough. This modulated high frequency current continues to be confined to the dominant paths defined by the bow arms and, in turn, generate an output electromagnetic signal 422 that emanates from the bow arms.

Peripheral outline 406 of the antenna arrangement serves to define further characteristics of dominant paths 430 and 432. In particular, outermost ends 402 and 404 of the bow arms serve not only in defining ports 408 and 410, but also to define reflector configurations which terminate the dominant paths. The reflector configuration of each outermost end is made up of first and second reflector segments 434 and 436 which are positioned on opposite sides of ports 408 and 410. These reflector segments may comprise terminating edge segments of non-insulating layers 212 and 214 at the outermost ends. In this regard, it should be appreciated that the antenna configuration of FIG. 5 is illustrative of a resonant antenna configuration in which the surface currents oscillate or resonate along the dominant paths. Such circulation of the surface currents is considered to be highly advantageous in either of a modulation implementation or a detection implementation since opportunities for the surface currents to leak out of the dominant paths are limited, as will be contrasted with prior art configurations in a subsequent discussion.

In the present example, each bow arm includes an elongation axis about which the ports and reflector segments are symmetrically arranged, however, this is not a requirement so long as the resonance functionality of the dominant paths is not overly suppressed. In terms of design concerns, it is recognized that the width of the dominant paths is influenced by a combination of factors at least including material properties of the bow arms and the angle of flare used in the bow arm (indicated as θ in FIG. 5).

In the instance of using assembly 400 in the emitter mode, the integrated device emits electromagnetic radiation into the bow arms to produce surface currents in dominant paths 430 and 432. Consequently, output electromagnetic signal 422 is produced in the absence of electromagnetic energy 421 incident upon the bow arms.

Turning now to a discussion considering the use of arrangement 400 in the detection mode, it is initially important to understand that the surface current resonates in the same manner, irrespective of whether it is produced in a detection, mixer, emitter or modulation mode. With that in mind, the present description is limited to those aspects of operation which are, in fact, different in this alternative mode. In the detection mode, an electromagnetic radiation 440 is incident on the bow arms whereby to induce the surface currents in resonant paths 430 and 432. The incident electromagnetic radiation may be within a frequency range of approximately several kHz to visible light and may be unmodulated, in such an instance as solar energy conversion, or modulated with any suitable information signal which is to be recovered, such as in optical communication. The surface currents are again confined to resonant paths 430 and 432 to be routed through the active device at the confronting portions of the bow arms such that the device acts on the surface current to emit a lower frequency output signal into the antenna arrangement, responsive to the surface current. The emitted output may comprise a direct current in the instance of solar energy conversion or a demodulated signal that has been detected as the envelope of incident electromagnetic radiation, serving as an amplitude modulated carrier. Again, the detected signal is emitted at a frequency that is sufficiently lower than the high frequency current so as to be present at least generally throughout the antenna including at ports 408 and 410. A detected output signal 442 is illustrated by an arrow that extends from the detection device directly to port 410. It is to be understood that such a detected output also travels from the detection device to port 408 but has not been shown due to illustrative constraints.

When assembly 400 is used in a mixer mode, incident electromagnetic energy 421 may include at least two different frequencies such as a first frequency and a second frequency. Mixing then produces an output difference frequency as output 442.

Inasmuch as device integrated antenna 400 has been described in detail above with respect to its structure and operational characteristics, attention is now directed to certain attendant advantages. Initially, it is important to understand that each of ports 408 and 410 is positioned sufficiently away from each of the resonant paths to isolate the lower frequency signal, traveling between the ports and the active device, from the surface currents that are confined to the resonant paths, at least from a practical standpoint. That is, the ports are spaced–apart from the resonant paths sufficient to produce isolation from the surface currents. In and by itself, this isolation is considered to be a sweeping advantage over prior art configurations. As a first advantage, leakage of surface currents into the ports is prevented. As a second advantage, overall efficiency is enhanced by reducing leakage currents. This latter advantage is readily understood with reference to using device integrated antenna 400, for example, in the detection mode. In this context, any active detection device exhibits a certain conversion efficiency. Therefore, a first portion of surface current that is traveling through the device at a given time is down-converted to the lower frequency. At the same time, a second, transmitted portion of the surface current travels through the device without conversion, while a third, reflected portion of the surface current is reflected upon attempting to enter the device. The present invention is considered to provide sweeping advantages with regard to the transmitted and reflected portions of the surface currents. These portions simply remain on the resonant paths of the antenna only to pass through the device on another round trip. Thus, conversion efficiency is enhanced since the surface current may be down-converted on a subsequent round trip. In addition, the designer may choose the resonant length (i.e., the reflector to reflector length of the dominant paths) so as to shape the dominant path for maximal impedance-matching with a particular device.

With the foregoing advantages in mind, it is worthwhile to briefly consider the approach of the prior art. Conventional resonant bowtie antennas generally use a center fed configuration wherein an input or output is transferred into or taken out of the bowtie at the intersection of the bow arms. For a device integrated configuration, the input/output port is at the bowtie intersection, co-located with the integrated active device. The present invention considers this approach as being unacceptable, with or without an integrated active device, at least for the reason that the resonant paths defined by the bowtie must travel through this intersection region. Accordingly, surface current leakage into the low frequency signal paths at the intersection point is virtually assured. As a further disadvantage, in a device integrated configuration, the leakage reduces overall efficiency in either a detection or modulation mode by removing a portion of the circulating resonant current. The present invention, in contrast, is thought to completely resolve this difficulty by using bow arm outermost end configurations, which integrate reflection segments so as to maintain resonant path oscillation, in cooperation with co-integrated ports for transmitting an input or output signal in isolation from the resonant surface currents. For example, if the device integrated antenna of the present invention is used in a detection mode, the resonating surface current has the opportunity to pass through a detection device arranged at the innermost end of the bow arms any number of times with little opportunity to leak out.

It is important to understand that the illustrated symmetrical configuration of FIG. 5 may be altered in any number of ways while remaining within the scope of these broad teachings. For example, the ports may be located at any position within the antenna assembly where interference with the resonant surface currents is avoided or is at least at a tolerable level.

Figure 6A:
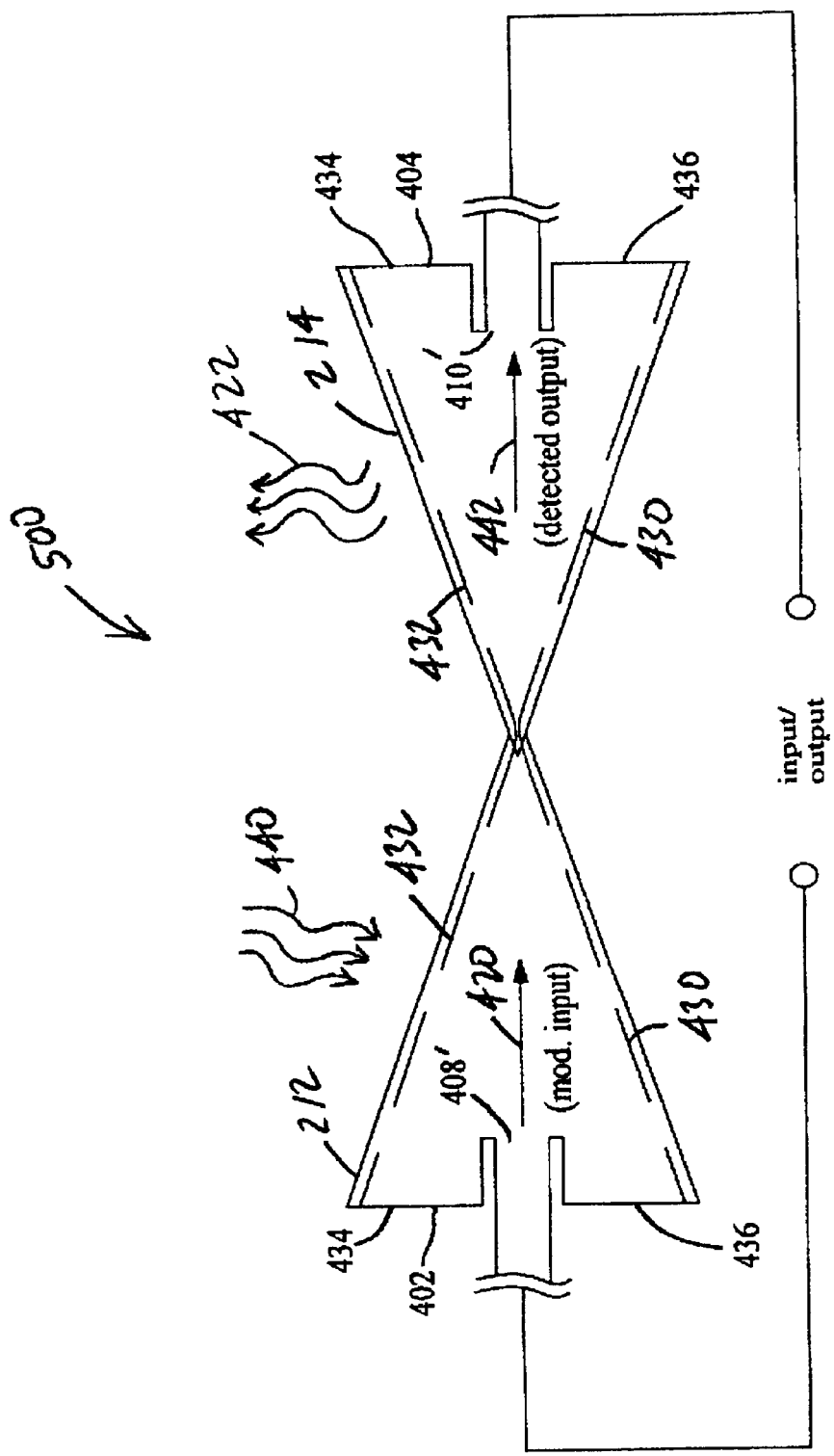
FIG. 6A is a diagrammatic illustration, in plan view, of a device integrated antenna assembly of the present invention, shown here to illustrate a resonant bowtie configuration having outermost ends including cooperating reflection segments and inset ports.

Attention is now directed to FIG. 6A, which illustrates another implementation of the device integrated antenna of the present invention that is generally indicated by the reference number 500. Since antenna arrangement 500 is similar to antenna arrangement 400 of FIG. 5, descriptions of like components will not be repeated for purposes of brevity and the reader is referred to discussions appearing above. Antenna arrangement 500 differs, however, in the configuration of its input/output ports. In this example, the ports are indicated by the reference numbers 408' and 410', including an inset configuration within outermost ends 402 and 404, respectively. It should be appreciated that antenna arrangement 500 shares all of the advantages of antenna arrangement 400 while providing still further advantages, as will be described immediately hereinafter.

Figure 6B:
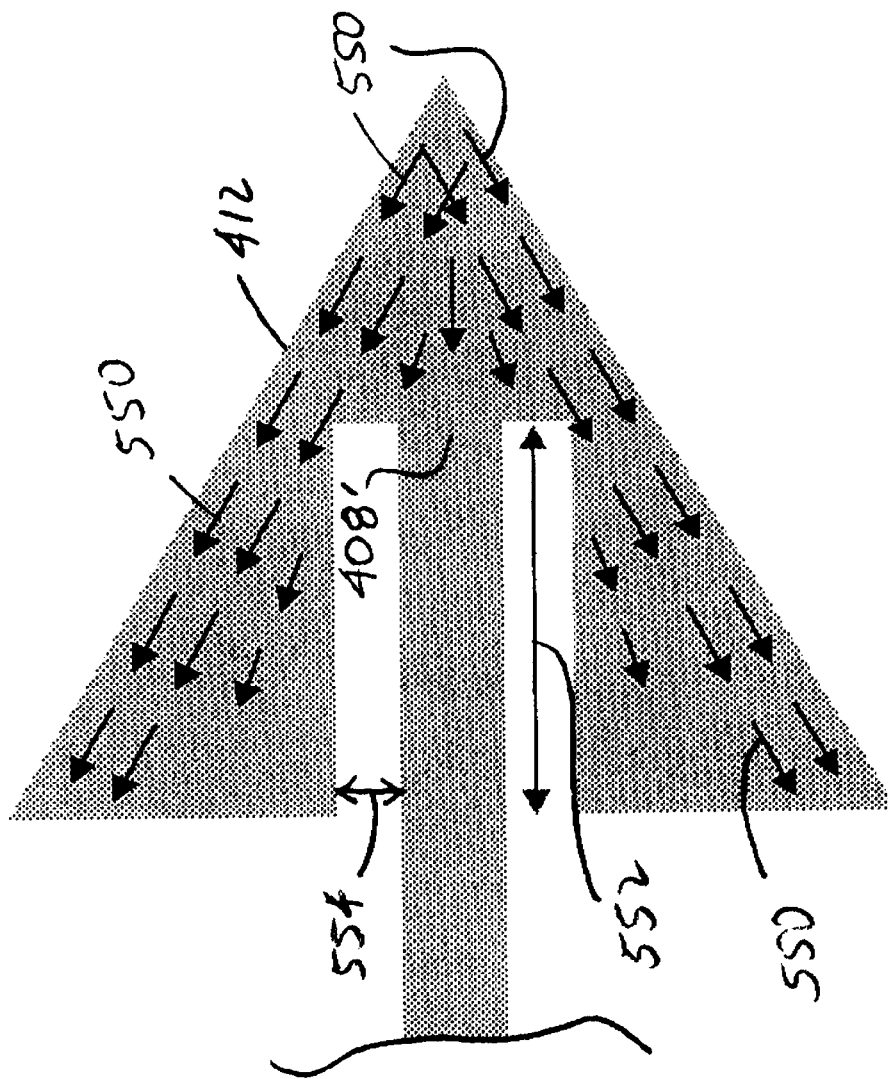
FIG. 6B is a diagrammatic illustration, in plan view, of one of the bow arms of the antenna of FIG. 6A, shown here to illustrate details with regard to design considerations in relation to the dominant paths defined by the antenna.

Turning to FIG. 6B in conjunction with FIG. 6A, a more enlarged plan view of bow arm 412 and inset port 408' are provided for illustration of certain characteristics of surface currents 550 (indicated as a plurality of arrows). It is noted that this illustration has been presented in a way which is thought to enhance the reader's understanding with respect to flow of surface currents and is not to scale. What is clearly shown, however, is that the dominant paths can advantageously be shaped by cutting an inset feed (port 408') to alter current flow when the dominant path is considered as the collective flow defined by the individual high frequency current arrows. Using this recognition, resonance and impedance matching conditions may be made more favorable. In particular, cut-aways of a length 552 and a width 554 define the inset geometry of port 408'. As another advantage, the path taken by the high frequency current is influenced such that interaction between the antenna and the device at the apex of the bow arm is most favorable for energy transfer into and/or out of the device.

It should be further appreciated that any port may be inset or outset by any suitable amount so long as interference/leakage with resonant paths 430 and 432 is at an acceptable value. Moreover, the inset/outset may be thought of as zero in the configuration of FIG. 3A having a straight line outermost end. Additionally, the ports in a single device integrated antenna may have different configurations. For example, one port may be outset while the opposing port is inset. Variation of the inset/outset values from one bow arm to the opposing bow arm can be advantageous, for example, when the bow arms are of different sizes. For instance, where one bow arm is lengthened relative to the other bow arm along its elongation axis, the inset may be increased to alter the port position for the lengthened bow arm.

At this juncture, it is appropriate to note that the present invention, as exemplified by the embodiments of FIGS. 5 and 6A, provides a resonant bowtie antenna that is not center fed. Applicants are unaware of such a highly advantageous configuration in the prior art.

Figure 7:
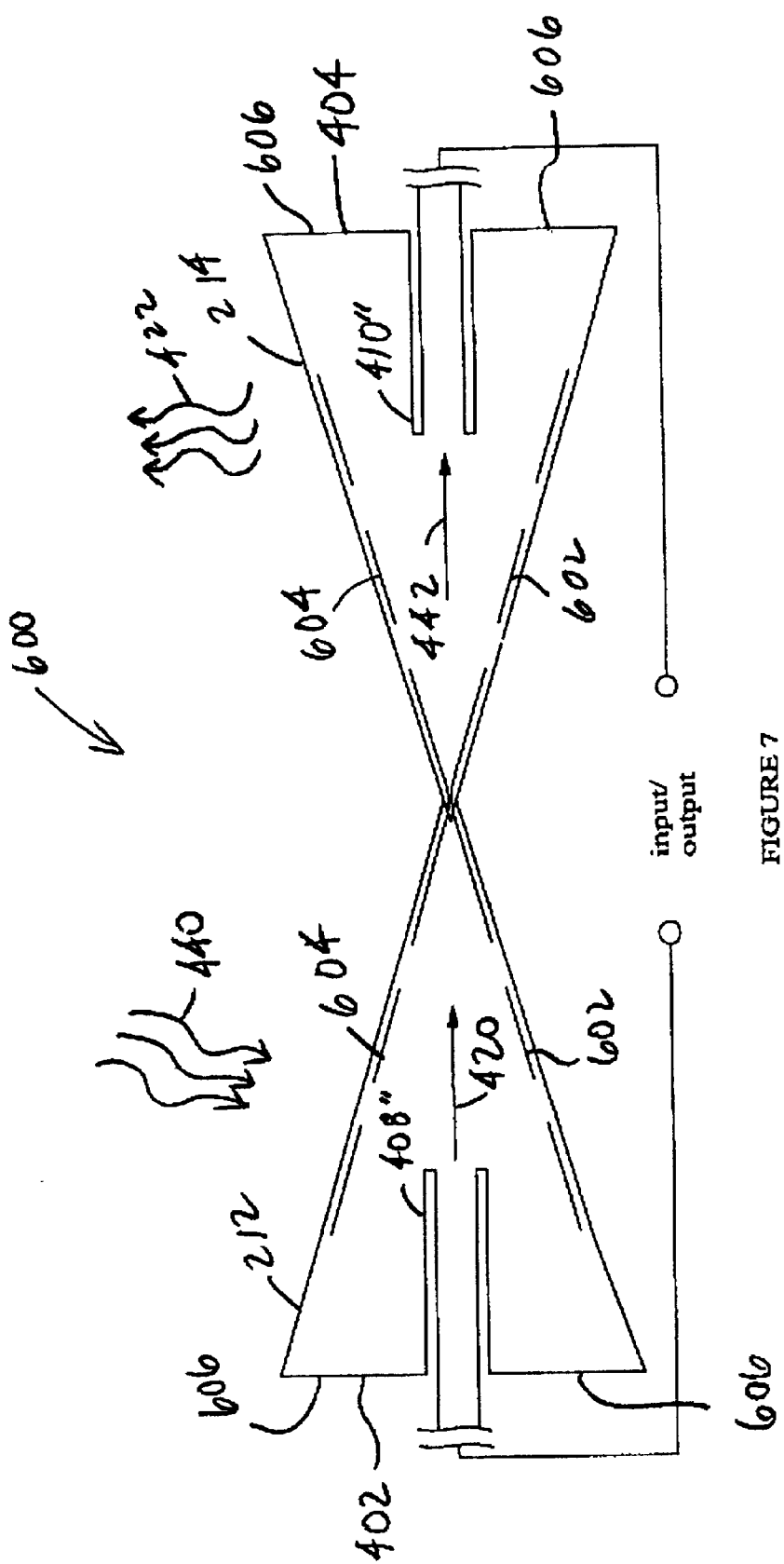
FIG. 7 is a diagrammatic illustration, in plan view, of a device integrated antenna assembly of the present invention, shown here to illustrate a non-resonant bowtie configuration having outermost ends including cooperating reflection segments and inset ports.

Turning now to FIG. 7, still another implementation of the device integrated antenna of the present invention is generally indicated by the reference number 600. While the configuration of antenna 600 resembles that of antenna 500, its configuration, as well as operation, is different in an important respect. In particular, antenna 600 includes a non-resonant configuration. As described above, in a non-resonant configuration, the paths which confine the surface currents are referred to as dominant, rather than resonant paths. A pair of opposing dominant paths are indicated by the reference numbers 602 and 604. In order to produce this non-resonant configuration, bow arms 212 and 214 are lengthened to an extent that causes surface currents that flow in the dominant paths to decay to an insignificant level. Accordingly, there is no significant surface current to reflect upon reaching outermost ends 402 and 404. While shown in a reflective configuration using reflective edge segments 606, the outermost ends may include end segments (not shown) that are configured so as not to reflect surface currents which may reach them. Sufficient non-reflectivity, of course, may serve to reduce or eliminate the need for elongation of the bow arms.

Still referring to FIG. 7, a pair of opposing ports are indicated by the reference numbers 408" and 410". Like the ports shown in FIG. 6A, these ports remain inset within the bow arms, but appear as being relatively further inset, primarily due to elongation of the bow arms. It should be observed that the ports are arranged such that the surface current in dominant paths 602 and 604 travels past the ports in a direction that is generally away from the active device at the innermost ends of the bow arms. Moreover, as a result of the highly advantageous configuration of antenna 600, the surface currents nearest the ports may still be at significant levels, while the ports remain isolated therefrom. In this regard, antenna 600 shares the advantages of previously described embodiments with respect to isolation, but in a nonresonant configuration.

Prior art non-resonant bowtie antennas are generally seen in what is generally referred to as an edge fed configuration wherein the entire outermost end of each bow arm connects to a low frequency lead. That is, the low frequency lead, proximate to the antenna, generally includes the same width as the outermost end of the bow arm and extends outwardly from the outermost end, maintaining the outermost end width for some distance which permits the surface currents to decay to negligible levels. Having eliminated the surface currents to a sufficient degree, the low frequency leads extending from the bow arms are merged into a suitable transmission line. This configuration is seen, for example, in FIG. 7, page 538 of the aforedescribed article entitled Imaging Antenna Arrays by David B. Rutledge, et al. [10].The present invention, in contrast, does not require elongated edge feed leads for purposes of surface current decay. Such surface currents are isolated from the low frequency ports due to a highly advantageous physical location which is, at least potentially, between opposing dominant paths. Accordingly, a more compact configuration is provided by the present invention.

It is to be understood that the present invention, and the advantages attributed thereto can be utilized in electromagnetic device applications other than solar energy conversion devices. These applications include, but are not limited to, detectors of all of the electromagnetic frequency spectrum, including superconducting detectors, emitters, modulators, repeaters and transistors, as disclosed in the applicants' copending U.S. patent application Ser. No. 09/860,972, filed simultaneously with the parent application of the present application and incorporated herein by reference. Additionally, an external bias voltage may be applied to the non-insulting layers in these applications to operate the device in a desired region on the I–V curve. Therefore, the present examples are to be considered as illustrative and not restrictive, and the invention is not to be limited to the details given herein but may be modified within the scope of the appended claims.

What is claimed is:

1. An assembly, comprising:
   a device configured for receiving at least one input to produce an output responsive thereto;
   an antenna arrangement for supporting said device to transfer said input to the device and further to transfer said output from said device such that the antenna arrangement supports a selected one of the input and the output as a high frequency current and said antenna arrangement includes a peripheral configuration which confines said high frequency current to at least one dominant path within the antenna arrangement so that the high frequency current oscillates in the dominant path and so that the other one of the input and the output is a lower frequency signal that is present at least generally throughout the antenna arrangement; and
   at least one port, within said antenna arrangement, positioned sufficiently away from said dominant path so as to isolate the lower frequency signal at the port from said high frequency current in said dominant path.

2. The assembly of claim 1 wherein said antenna arrangement includes at least a first reflector segment at one side of said device and at least a second reflector segment on an opposite side of said device such that the first and second reflector segments serve to define opposing ends of said dominant path.

3. The assembly of claim 2 wherein said port is positioned spaced-apart from said first and second reflector segments to substantially reduce leakage of said high frequency current into the port.

4. The assembly of claim 1 wherein said antenna arrangement includes a first antenna portion and a second antenna portion defining first and second electrically conductive surfaces, respectively, and which electrically conductive surfaces are at least generally planar for conducting said high frequency current such that the first and second antenna portions cooperatively provide an overall outline of the antenna arrangement and the first and second electrically conductive surfaces each include first and second confronting portions thereof which are arranged in a confronting relationship and said device is positioned between said first and second confronting portions.

5. The assembly of claim 4 wherein said first and second electrically conductive surfaces define said overall outline at least generally shaped as a bowtie.

6. The assembly of claim 4 wherein each of the first and second antenna portions each includes an outer end, farthest from said device and having an outer end width and each of the first and second antenna portions further includes a length extending from said outer end to an inner end proximate to said first and second confronting portions such that each of the first and second antenna portions includes a first side margin and a second side margin each extending from the outer end to the inner end and cooperating with the outer end width to define a first dominant path extending from the outer end of the first antenna portion to the outer end of the second antenna portion adjacent to the first side margin of each of the first and second antenna portions and extending through said device, and defining a second dominant path extending from the outer end of the first antenna portion to the outer end of the second antenna portion adjacent to the second side margin of each of the first and second antenna portions and extending through said device.

7. The assembly of claim 6 wherein each of the first and second antenna portions includes a generally triangular outline.

8. The assembly of claim 7 wherein the generally triangular outline of each of the first and second antenna portions cooperates to define the overall outline of the antenna arrangement, at least generally, as a bowtie shape.

9. The assembly of claim 6 wherein said inner end of each of the first and second antenna portions includes an inner end width which is less than the outer end width of each of the first and second antenna portions.

10. The assembly of claim 6 wherein a first port is positioned on the outer end width of said first antenna portion between the first and second dominant paths.

11. The assembly of claim 10 wherein the first port is, at least approximately, centered between the first and second dominant paths.

12. The assembly of claim 10 wherein a second port is positioned on the outer end width of said second antenna portion between the first and second dominant paths.

13. The assembly of claim 12 wherein the second port is, at least approximately, centered between the first and second dominant paths.

14. The assembly of claim 6 wherein a first port is positioned on the outer end width of said first antenna portion between the first and second dominant paths and a second port is positioned on the outer end width of said second antenna portion between the first and second dominant paths and said lower frequency signal is present across the first and second ports.

15. The assembly of claim 6 wherein the outer end width of each of the first and second antenna portions is configured for reflecting said surface current in said first and second dominant paths and for passing the lower frequency signal for each of the first and second ports, respectively.

16. The assembly of claim 1 wherein said high frequency current is produced responsive to an incident electromagnetic radiation that is incident upon the antenna arrangement at a given frequency and said device is configured for emitting said lower frequency signal into the antenna arrangement responsive to the incident electromagnetic radiation.

17. The assembly of claim 16 wherein the incident electromagnetic radiation is modulated and said lower frequency signal is a demodulated signal.

18. The assembly of claim 16 wherein said device is selected as one of a MIM diode, a MIIM diode, a Schottky diode and a microbolometer.

19. The assembly of claim 1 wherein said port serves as an input port which receives the lower frequency signal for transfer to said device as said input and an incident electromagnetic radiation is incident on said antenna as an additional input in a way which generates said high frequency current such that the high frequency current travels through said device and the device modulates the high frequency current passing therethrough and back into the antenna arrangement to cause a modulated electromagnetic radiation to be radiated from the antenna arrangement.

20. The assembly of claim 19 wherein said device is selected as one of a MIM diode, a MIIM diode, a Schottky diode, a Josephson junction, and a microbolometer.

21. The assembly of claim 1 wherein said device is an emitter and wherein said port serves as an input port which receives the lower frequency signal for transfer to said emitter as said input in a way which causes the emitter to inject said high frequency current into the antenna arrangement to cause a modulated electromagnetic radiation to be radiated from the antenna arrangement.

22. The assembly of claim 1 wherein an input electromagnetic radiation is incident upon the antenna arrangement having at least a first frequency and a second frequency to produce said high frequency current in the antenna arrangement including the first frequency and the second frequency and said device is a mixer which receives the high frequency current to produce said lower frequency signal as a difference frequency between the first frequency and the second frequency for transfer to the port.

23. An assembly, comprising:
   device means for receiving at least one input to produce an output responsive thereto;
   antenna means for supporting said device to transfer said input to the device and further to transfer said output from said device such that the antenna means supports a selected one of the input and the output as a high frequency current and said antenna means includes peripheral configuration means for confining said high frequency current to at least one dominant path within the antenna means so that the high frequency current oscillates in the dominant path and so that the other one of the input and the output is a lower frequency signal that is present at least generally throughout the antenna means; and
   port means, as part of said antenna means, positioned sufficiently away from said dominant path so as to isolate the lower frequency signal at the port means from said high frequency current in said dominant path.

24. In producing an assembly, a method comprising the steps of:
   providing a device for receiving at least one input to produce an output responsive thereto;
   supporting said device within an antenna arrangement to transfer said input to the device and to transfer said output from said device such that the antenna arrangement supports a selected one of the input and the output as a high frequency current and said antenna arrangement includes a peripheral configuration which confines said high frequency current to at least one dominant path within the antenna arrangement so that the high frequency current oscillates in the dominant path and so that the other one of the input and output is a lower frequency signal that is present at least generally throughout the antenna arrangement; and
   positioning at least one port, within said antenna arrangement, sufficiently away from said dominant path so as to isolate the lower frequency signal at the port from said high frequency current within the dominant path.

25. The method of claim 24 wherein the step of configuring said antenna arrangement includes the steps of arranging at least a first reflector segment at one side of said device and arranging at least a second reflector segment on an opposite side of said device such that the first and second reflector segments serve to define opposing ends of said dominant path.

26. The method of claim 25 wherein the step of positioning said port includes the step of locating the port spaced-apart from said first and second reflector segments to substantially reduce leakage of said surface current into the port.

27. The method of claim 24 wherein said antenna arrangement is configured to include a first antenna portion and a second antenna portion defining first and second electrically conductive surfaces, respectively, and which electrically conductive surfaces are at least generally planar for receiving said electromagnetic radiation such that the first and second antenna portions cooperatively provide an overall outline of the antenna arrangement and arranging the first and second electrically conductive surfaces to include first and second confronting portions thereof in a confronting relationship and the step of locating said device includes the step of positioning the device between said first and second confronting portions.

28. The method of claim 27 wherein said first and second electrically conductive surfaces are formed to define said overall outline at least generally shaped as a bowtie.

29. The method of claim 27 wherein each of the first and second antenna portions is configured to include an outer end, farthest from said device and having an outer end width and each of the first and second antenna portions is further configured having a length extending from said outer end to an inner end proximate to said first and second confronting portions such that each of the first and second antenna portions includes a first side margin and a second side margin each extending from the outer end to the inner end and cooperating with the outer end width to define a first dominant path extending from the outer end of the first antenna portion to the outer end of the second antenna portion adjacent to the first side margin of each of the first and second antenna portions and extending through said device, and defining a second dominant path extending from the outer end of the first antenna portion to the outer end of the second antenna portion adjacent to the second side margin of each of the first and second antenna portions and extending through said device.

30. The method of claim 29 wherein each of the first and second antenna portions is formed to include a generally triangular outline.

31. The method of claim 30 wherein the generally triangular outline of each of the first and second antenna portions cooperates to define the overall outline of the antenna arrangement, at least generally, as a bowtie shape.

32. The method of claim 29 wherein said inner end of each of the first and second antenna portions is configured to include an inner end width which is less than the outer end width of each of the first and second antenna portions.

33. The method of claim 29 wherein a first port is positioned on the outer end width of said first antenna portion between the first and second dominant paths.

34. The method of claim 33 wherein the first port is, at least approximately, centered between the first and second dominant paths.

35. The method of claim 33 wherein said positioning step includes the step of positioning a second port on the outer end width of said second antenna portion between the first and second dominant paths.

36. The method of claim 35 wherein the second port is, at least approximately, centered between the first and second dominant paths.

37. The method of claim 29 wherein said positioning step includes the steps of locating a first port on the outer end width of said first antenna portion between the first and second dominant paths and locating a second port on the outer end width of said second antenna portion between the first and second dominant paths and said method further includes the step of taking said output across the first and second ports.

38. The method of claim 29 wherein the outer end width of each of the first and second antenna portions is configured for reflecting said surface currents in said first and second dominant paths and for passing the output emitted by said device to each of the first and second ports, respectively.

39. The method of claim 24 wherein said electromagnetic radiation is received at a given frequency and including the step of using said device to emit said output at a different frequency responsive to said given frequency.

40. The method of claim 39 wherein said different frequency is sufficiently lower than said given frequency so as to be present throughout said antenna arrangement.

41. The method of claim 24 wherein said high frequency current is produced responsive to an incident electromagnetic radiation that is incident upon the antenna arrangement as an additional input at a given frequency and said device is configured for emitting said lower frequency signal into the antenna arrangement responsive to the incident electromagnetic radiation.

42. The method of claim 39 wherein the incident electromagnetic radiation is modulated and said lower frequency signal is a demodulated signal.

43. The method of claim 41 wherein said device is selected as one of a MIM diode, a MIIM diode, a Schottky diode, a Josephson junction, and a microbolometer.

44. The method of claim 24 wherein said port serves as an input port which receives the lower frequency signal for transfer to said device as said input and an incident electromagnetic radiation is incident on said antenna as an additional input in a way which generates said high frequency current such that the high frequency current travels through said device and the device modulates the high frequency current passing therethrough and back into said to cause a modulated electromagnetic radiation to be radiated from the antenna arrangement.

45. The method of claim 44 including the step of selecting said device as one of a MIM diode, a MIIM diode, a Schottky diode, a Josephson junction, and a microbolometer.

46. The method of claim 24 wherein said device is an emitter and wherein said port serves as an input port which receives the lower frequency signal for transfer to said emitter as said input in a way which causes the emitter to inject said high frequency current into the antenna arrangement to cause a modulated electromagnetic radiation to be radiated from the antenna arrangement.

47. The method of claim 24 wherein an input electromagnetic radiation is incident upon the antenna arrangement having at least a first frequency and a second frequency to produce said high frequency current in the antenna arrangement including the first frequency and the second frequency and said device is a mixer which receives the high frequency current to produce said lower frequency signal as a difference frequency between the first frequency and the second frequency for transfer to the port.

48. An assembly, comprising:
a device configured for receiving at least one input to produce an output responsive thereto;
an antenna arrangement for supporting said device to transfer said input to the device and further to transfer said output from said device such that the antenna arrangement supports a selected one of the input and the output as a high frequency current and said antenna arrangement includes a peripheral configuration which confines said high frequency current to at least one dominant path within the antenna arrangement and the other one of the input and the output is a lower frequency signal that is present at least generally throughout the antenna arrangement; and
at least one port, within said antenna arrangement, at a location selected such that the high frequency current travels past the port in at least one direction that is away from said device, and which port is positioned sufficiently away from said dominant path so as to isolate the lower frequency signal at the port from said high frequency current in said dominant path.

49. In producing an assembly, a method comprising the steps of:
providing a device for receiving at least one input to produce an output responsive thereto;
configuring an antenna arrangement for supporting said device to transfer said input to the device and further to transfer said output from said device such that the antenna arrangement supports a selected one of the input and the output as a high frequency current and said antenna arrangement includes a peripheral configuration which confines said high frequency current to at least one dominant path within the antenna arrangement and the other one of the input and the output is a lower frequency signal that is present at least generally throughout the antenna arrangement; and
arranging at least one port, within said antenna arrangement, at a location selected such that the high frequency current travels past the port in at least one direction that is away from said device, and which port is positioned sufficiently away from said dominant path so as to isolate the lower frequency signal at the port from said high frequency current in said dominant path.

50. An assembly, comprising:
a device configured for receiving at least one input to produce an output responsive thereto;
an antenna arrangement for supporting said device to transfer said input to the device and further to transfer said output from said device such that the antenna arrangement supports a selected one of the input and the output as a high frequency current and said antenna arrangement includes a peripheral configuration which confines said high frequency current to at least one resonant path within the antenna arrangement so that the high frequency current oscillates in the resonant path between a pair of opposing first and second reflector configurations that are formed as part of the peripheral outline and so that the other one of the input and the output is a lower frequency signal that is present at least generally throughout the antenna arrangement; and at least one port, within said antenna arrangement, positioned sufficiently away from each one of said first and second reflector configurations so as to sustain reflection of said surface current in said resonant path while conducting said lower frequency signal.

51. The assembly of claim 50 wherein said antenna arrangement includes the first reflector configuration to one side of said device and the second reflector configuration on an opposite side of said device such that the device is between the pair of reflector configurations and in said resonant path.

52. The assembly of claim 50 including a first and a second electrically conductive surface which are at least generally planar and form opposing first and second bow arms, respectively, to cooperatively define said peripheral outline at least generally shaped as a bowtie and each of said bow arms includes an outermost edge, farthest from said device, serving in part as one of said pair of reflector configurations.

53. The assembly of claim 52 wherein each outermost edge includes a width and said output is taken from at least one said outermost edge using less than said width.

54. The assembly of claim 53 wherein each said outermost edge defines said reflector configuration as a first and a second reflecting end segment thereof and said port is positioned on at least one of said outermost edges between the first and second reflecting end segments.

55. The assembly of claim 54 wherein said outermost edge includes an inset configuration such that the port is inset toward said device with respect to a straight line defined between said first and second end segments.

56. The assembly of claim 54 wherein said port is located at least approximately midway between said first and second reflecting end segments.

57. The assembly of claim 53 wherein each of the first and second bow arms includes a length extending from said outermost edge to an inner end, proximate to said device, such that each of the first and second bow arms includes a first side margin and an opposing, second side margin, each side margin extending from the outermost edge of one of the bow arms to its inner end and said first and second bow arms cooperate to define a first resonant path extending from the outermost edge of the first bow arm to the outermost edge of the second bow arm adjacent to the first side margin of each of the first and second bow arms and extending through said device, and defining an opposing, second resonant path extending from the outermost edge of the first bow arm to the outermost edge of the second bow arm adjacent to the second side margin of each of the first and second bow arms and extending through said device.

58. The assembly of claim 57 wherein the first and second electrically conductive surfaces each include first and second confronting portions thereof which are arranged in a confronting relationship and said device is positioned between said first and second confronting portions.

59. The assembly of claim 58 wherein each said outermost edge defines said reflector configuration as a first and a second reflecting end segment thereof and a first port is positioned on a first one of said outermost edges of a first one of the bow arms between its first and second end segments.

60. The assembly of claim 59 wherein a second port is positioned on a second one of said outermost edges of a second one of the bow arms between its first and second end segments.

61. The assembly of claim 50 wherein said high frequency current is produced responsive to an electromagnetic radiation that is incident upon the antenna arrangement as an additional input at a given frequency and said device is configured for emitting said lower frequency signal into the antenna arrangement at a different frequency responsive to the incident electromagnetic radiation.

62. The assembly of claim 57 wherein the incident electromagnetic radiation is modulated and said lower frequency signal is a demodulated signal.

63. The assembly of claim 61 wherein said device is selected as one of a MIM diode, a MIIM diode, a Schottky diode, a Josephson junction, and a microbolometer.

64. The assembly of claim 50 wherein said port serves as a input port which receives the lower frequency signal for transfer to said device as said input and an incident electromagnetic radiation is incident on said antenna as an additional input in a way which generates said high frequency current such that the high frequency current travels through said device and the device modulates the high frequency current passing therethrough and back into the antenna arrangement to cause a modulated electromagnetic radiation to be radiated from the antenna arrangement.

65. The assembly of claim 64 wherein said device is selected as one of a MIM diode, a MIIM diode, a Schottky diode, a Josephson junction, and a microbolometer.

66. The assembly of claim 50 wherein said device is an emitter and wherein said port serves as an input port which receives the lower frequency signal for transfer to said emitter as said input in a way which causes the emitter to inject said high frequency current into the antenna arrangement to cause electromagnetic radiation to be radiated from the antenna arrangement.

67. The assembly of claim 50 wherein an input electromagnetic radiation is incident upon the antenna arrangement having at least a first frequency and a second frequency to produce said high frequency current in the antenna arrangement including the first frequency and the second frequency and said device is a mixer which receives the high frequency current to produce said lower frequency signal as a difference frequency between the first frequency and the second frequency for transfer to the port.

68. In producing an assembly, a method comprising the steps of:

providing a device configured for receiving at least one input to produce an output responsive thereto;

configuring an antenna arrangement for supporting said device to transfer said input to the device and further to transfer said output from said device such that the antenna arrangement supports a selected one of the input and the output as a high frequency current and said antenna arrangement includes a peripheral configuration which confines said high frequency current to at least one resonant path within the antenna arrangement so that the high frequency current oscillates in the resonant path between a pair of opposing first and second reflector configurations that are formed as part of the peripheral outline and so that the other one of the input and the output is a lower frequency signal that is present at least generally throughout the antenna arrangement; and positioning at least one port, within said antenna arrangement, sufficiently away from each one of said first and second reflector configurations so as to sustain reflection of said surface current in said resonant path while conducting said lower frequency signal.

69. The method of claim 68 including the step of arranging the first reflector configurations to one side of said device and the other one of said second reflector configurations on an opposite side of said device such that the device is between the pair of reflector configurations along said resonant path.

70. The method of claim 68 wherein said antenna is arranged to include a first and a second electrically conductive surface which are at least generally planar and form opposing first and second bow arms, respectively, to cooperatively define said peripheral outline at least generally shaped as a bowtie and each of said bow arms includes an outermost edge, farthest from said device, serving in part as one of said pair of reflector configurations.

71. The method of claim 70 wherein each outermost edge is configured including a width and said method includes the step of taking said output from at least one said outermost edge using less than said width.

72. The method of claim 71 including the steps of configuring each said outermost edge to define said reflector configuration as a first and a second reflecting end segment thereof and positioning the port on at least one of said outermost edges between the first and second reflecting end segments.

73. The method of claim 72 wherein said outermost edge is further configured including an inset configuration such that the port is inset toward said device with respect to a straight line defined between said first and second end segments.

74. The method of claim 72 including the step of locating said port at least approximately midway between said first and second reflecting end segments.

75. The method of claim 71 wherein each of the first and second bow arms is arranged to include a length extending from said outermost edge to an inner end, proximate to said device, such that each of the first and second bow arms includes a first side margin and an opposing, second side margin, each side margin extending from the outermost edge of one of the bow arms to its inner end and said first and second bow arms cooperate to define a first resonant path extending from the outermost edge of the first bow arm to the outermost edge of the second bow arm adjacent to the first side margin of each of the first and second bow arms and extending through said device, and defining an opposing, second resonant path extending from the outermost edge of the first bow arm to the outermost edge of the second bow arm adjacent to the second side margin of each of the first and second bow arms and extending through said device.

76. The method of claim 75 including the steps of configuring the first and second electrically conductive surfaces to each include first and second confronting portions thereof which are arranged in a confronting relationship and positioning said device between said first and second confronting portions.

77. The method of claim 76 wherein each said outermost edge is formed to define said reflector configuration as a first and a second reflecting end segment thereof and positioning a first port on a first one of said outermost edges of a first one of the bow arms between the first and second end segments.

78. The method of claim 77 including the step of further positioning a second port on a second one of said outermost edges of a second one of the bow arms between its first and second end segments.

79. The method of claim 68 wherein said high frequency current is produced responsive to an incident electromagnetic radiation that is incident upon the antenna arrangement as an additional input at a given frequency and said device is configured for emitting said lower frequency signal into the antenna arrangement responsive to the incident electromagnetic radiation.

80. The method of claim 73 wherein the incident electromagnetic radiation is modulated and said lower frequency signal is a demodulated signal.

81. The method of claim 79 wherein said device is selected as one of a MIM diode, a MIIM diode, a Schottky diode, a Josephson junction, and a microbolometer.

82. The method of claim 68 wherein said port serves as an input port which receives the lower frequency signal for transfer to said device as said input and an incident electromagnetic radiation is incident on said antenna as an additional input in a way which generates said high frequency current such that the high frequency current travels through said device and the device modulates the high frequency current passing therethrough and back into the antenna arrangement to cause a modulated electromagnetic radiation to be radiated from the antenna arrangement.

83. The method of claim 82 including the step of selecting said device as one of a MIM diode, a MIIM diode, a Schottky diode, a Josephson junction, and a microbolometer.

84. The method of claim 68 wherein said device is an emitter and wherein said port serves as an input port which receives the lower frequency signal for transfer to said emitter as said input in a way which causes the emitter to inject said high frequency current into the antenna arrangement to cause electromagnetic radiation to be radiated from the antenna arrangement.

85. The method of claim 68 wherein an input electromagnetic radiation is incident upon the antenna arrangement having at least a first frequency and a second frequency to produce said high frequency current in the antenna arrangement including the first frequency and the second frequency and said device is a mixer which receives the high frequency current to produce said lower frequency signal as a difference frequency between the first frequency and the second frequency for transfer to the port.

86. An assembly, comprising:
a device configured for receiving at least one input to produce an output responsive thereto;
an antenna arrangement including a bowtie peripheral configuration defining a bowtie intersection for supporting said device at the bowtie intersection to transfer said input to the device and further to transfer said output from said device such that the antenna arrangement supports a selected one of the input and the output as a high frequency current and said bowtie peripheral configuration confines said high frequency current to at least one dominant path within the antenna arrangement so that the high frequency current oscillates in the dominant path traveling through said bowtie intersection and so that the other one of the input and the output is a lower frequency signal that is present at least generally throughout the antenna arrangement; and
at least one port, within the antenna arrangement, positioned spaced apart from said bowtie intersection and sufficiently away from said dominant path so as to isolate the lower frequency signal at the port from said high frequency current in said dominant path.

87. In producing an assembly, a method comprising the steps of:
providing a device configured for receiving at least one input to produce an output responsive thereto;
configuring an antenna arrangement to include a bowtie peripheral configuration defining a bowtie intersection for supporting said device at the bowtie intersection to transfer said input to the device and further to transfer said output from said device such that the antenna arrangement supports a selected one of the input and the output as a high frequency current and said bowtie peripheral configuration confines said high frequency current to at least one dominant path within the antenna arrangement so that the high frequency current oscillates in the dominant path traveling through said bowtie intersection and so that the other one of the input and the output is a lower frequency signal that is present at least generally throughout the antenna arrangement; and positioning at least one port, within the antenna arrangement, spaced apart from said bowtie intersection and sufficiently away from said dominant path so as to isolate the lower frequency signal at the port from said high frequency current in said dominant path.

* * * * *